(12) United States Patent
Ensinger et al.

(10) Patent No.: US 9,461,636 B2
(45) Date of Patent: Oct. 4, 2016

(54) TECHNIQUES FOR ENHANCING SPURIOUS FREE DYNAMIC RANGE PERFORMANCE

(71) Applicant: BAE Systems Information and Electronic Systems Integration Inc., Nashua, NH (US)

(72) Inventors: Robert Ensinger, Bedford, NH (US); David M. Gillespie, Manchester, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 14/631,982

(22) Filed: Feb. 26, 2015

(65) Prior Publication Data

US 2015/0171846 A1    Jun. 18, 2015

Related U.S. Application Data

(62) Division of application No. 13/621,547, filed on Sep. 17, 2012, now Pat. No. 9,002,916.

(60) Provisional application No. 61/535,858, filed on Sep. 16, 2011.

(51) Int. Cl.
  *H03K 21/00* (2006.01)
  *H03K 5/1252* (2006.01)
  *G06F 1/10* (2006.01)

(52) U.S. Cl.
  CPC .............. *H03K 5/1252* (2013.01); *G06F 1/10* (2013.01)

(58) Field of Classification Search
  CPC ....................................................... H03K 4/90
  USPC .......... 327/105–106, 113–118; 708/270–272
  See application file for complete search history.

(56) References Cited

U.S. PATENT DOCUMENTS

| | | | |
|---|---|---|---|
| 5,394,117 A * | 2/1995 | Cohen | 331/47 |
| 5,801,589 A * | 9/1998 | Tajima | 331/1 R |
| 6,347,325 B1 | 2/2002 | Ribner et al. | |
| 7,242,225 B2 * | 7/2007 | Klage | 327/106 |
| 7,557,619 B1 | 7/2009 | Dick et al. | |

(Continued)

OTHER PUBLICATIONS

"Spurious Free Dynamic Range (SFDR)," Datatranslation (http://www.datatranslation.com/resources/techref/dataacquisition/sfdr-overview.asp), date accessed: Sep. 14, 2011, 1 page.

(Continued)

*Primary Examiner* — Dinh T Le
(74) *Attorney, Agent, or Firm* — Daniel J. Long; Kimberly A. Peaslee

(57) ABSTRACT

Techniques and architecture are disclosed for improving spurious performance in a signal generator/system. The disclosed techniques/architecture can be used, for example, to enhance/improve the wideband and/or narrowband spurious free dynamic range (SFDR) between a given carrier signal and spurious signals. In some example instances, wideband and/or narrowband SFDR may be improved to about −40 dBc or better. In some other example instances, wideband and/or narrowband SFDR may be improved to about −70 dBc or better. The disclosed techniques/architecture can be implemented in a wide variety of signal generators/systems, such as a direct digital synthesizer (DDS)-based system, and over a wide range of input clock frequencies (e.g., in the range of about 10 MHz to 40 GHz, or higher).

8 Claims, 18 Drawing Sheets

(56) References Cited

U.S. PATENT DOCUMENTS

| | | |
|---|---|---|
| 7,912,882 B2 * | 3/2011 | Kim .............................. 708/271 |
| 8,224,234 B1 | 7/2012 | Schuster et al. |
| 2010/0156472 A1 | 6/2010 | Pellon |
| 2012/0013494 A1 | 1/2012 | Song |

OTHER PUBLICATIONS

"dBc (decibels relative to the carrier)," Wikipedia, The Free Encyclopedia (http://en.wikipedia.org/wiki/DBc), date accessed: Sep. 14, 2011, 2 pages.

"Spurious emission," Wikipedia, The Free Encyclopedia (http://en.wikipedia.org/wiki/Spurious_emission), date accessed: Sep. 14, 2011, 2 pages.

"Spurious-free dynamic range," Wikipedia, The Free Encyclopedia (http://en.wikipedia.org/wiki/Spurious-free_dynamic_range), date accessed: Sep. 14, 2011, 2 pages.

Kester, Walt, "Understand SINAD, ENOB, SNR, THD, THD+N, and SFDR so You Don't Get Lost in the Noise Floor," Analog Devices—MT-003 Tutorial, Oct. 2008, pp. 1-8.

* cited by examiner

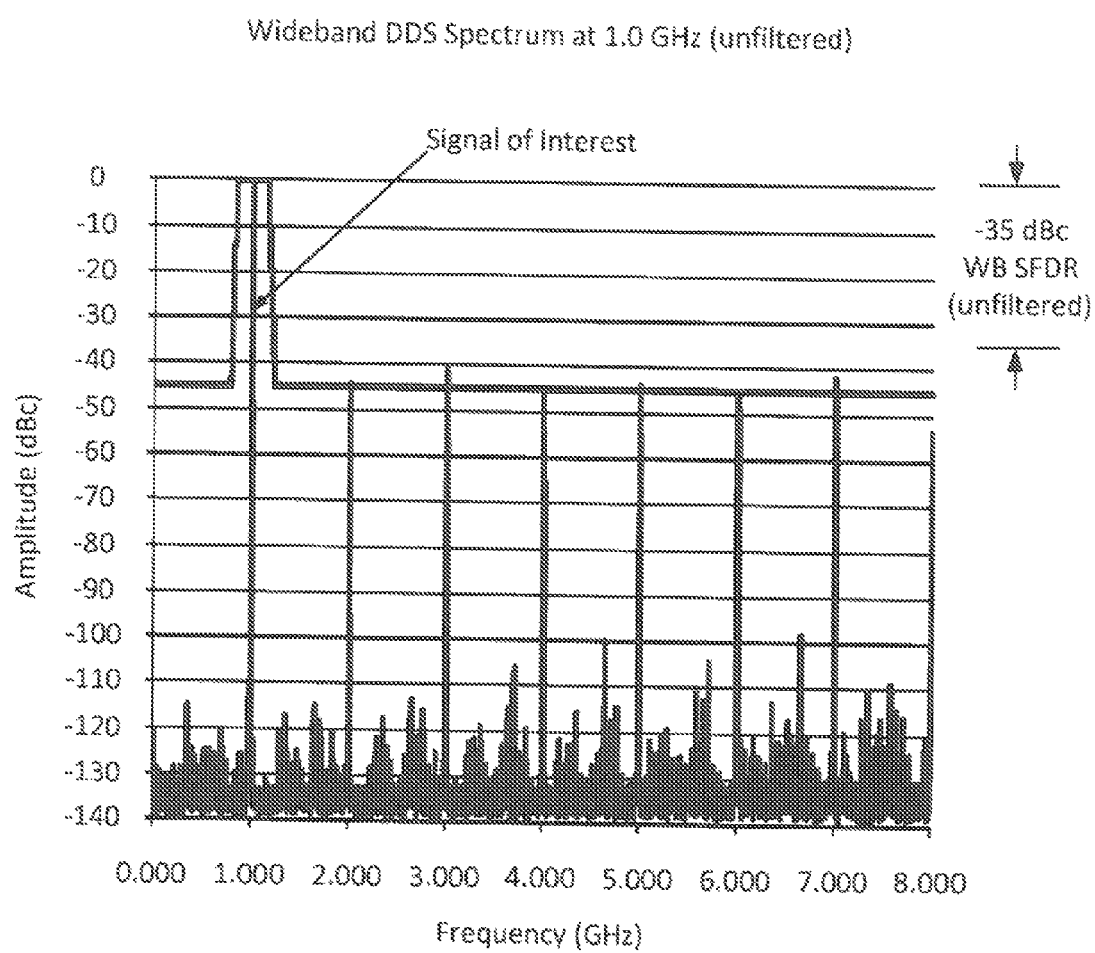

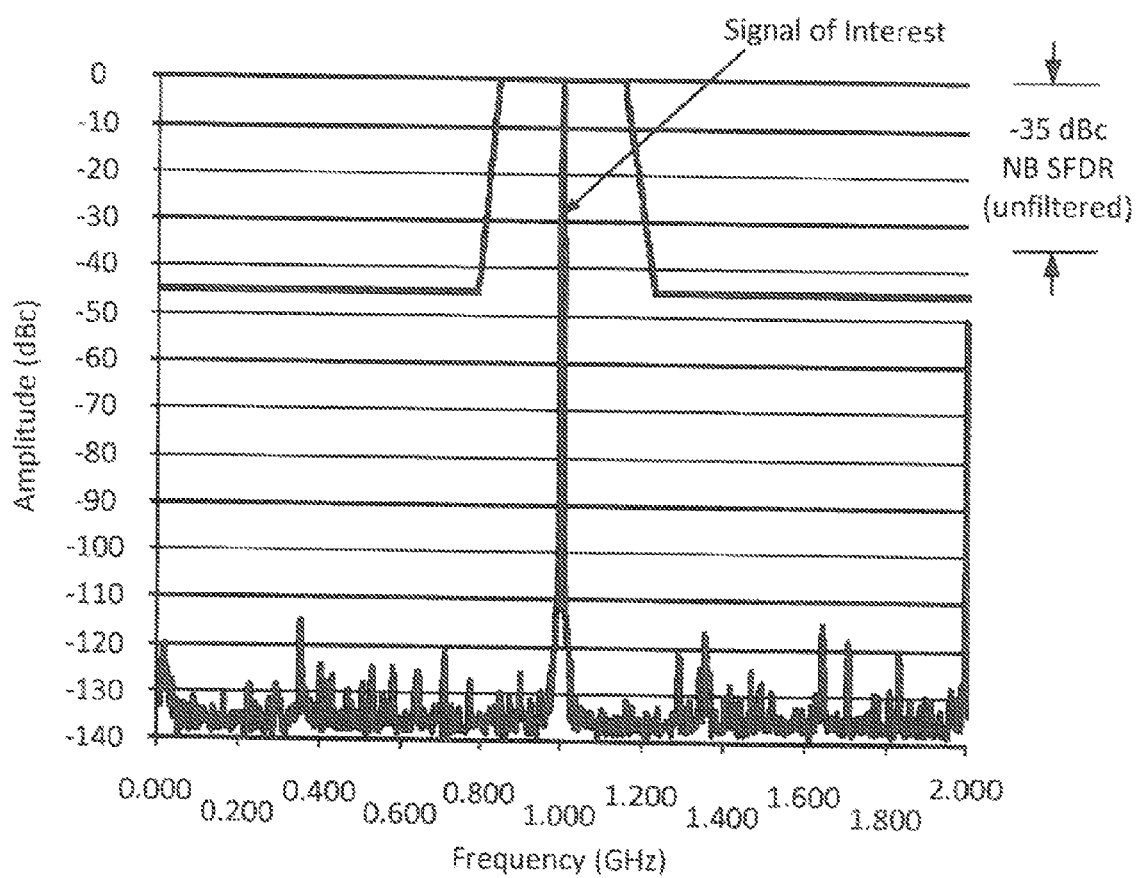

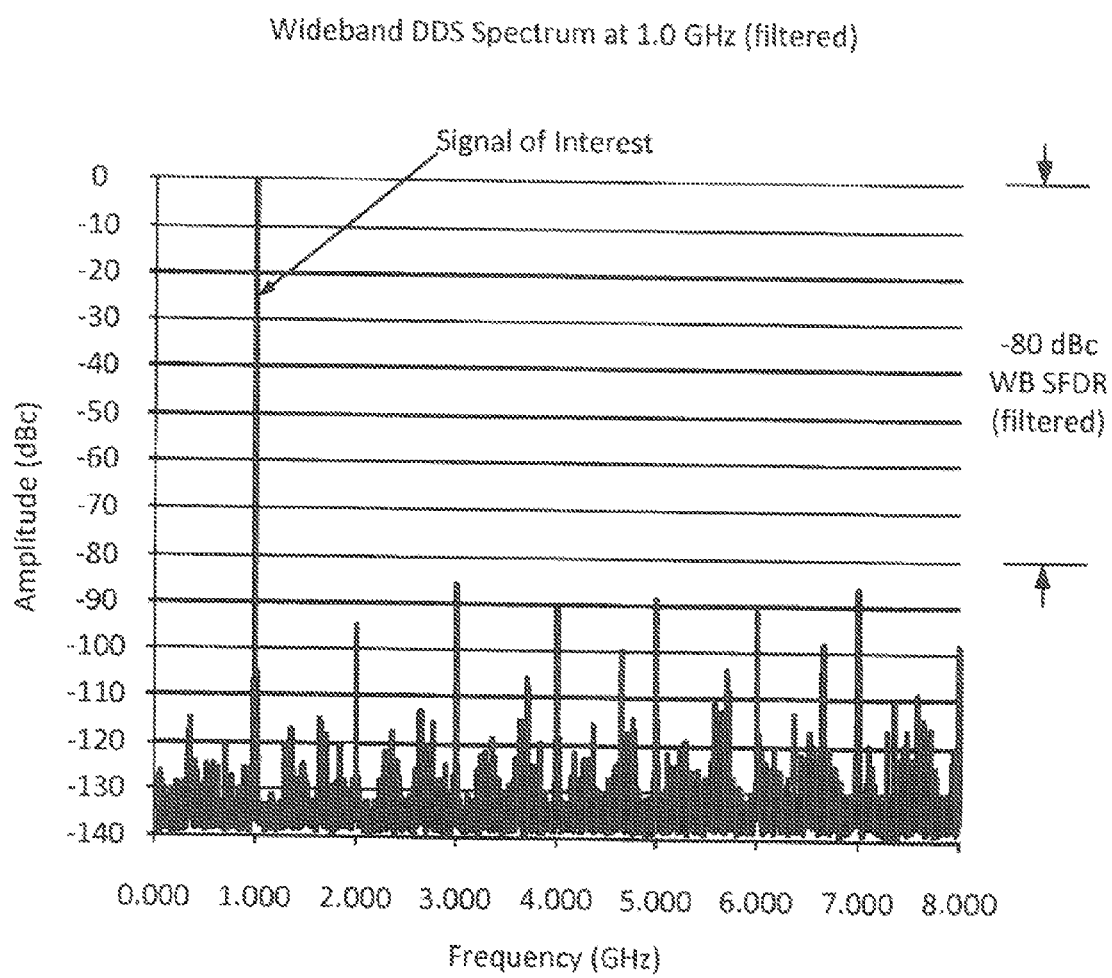

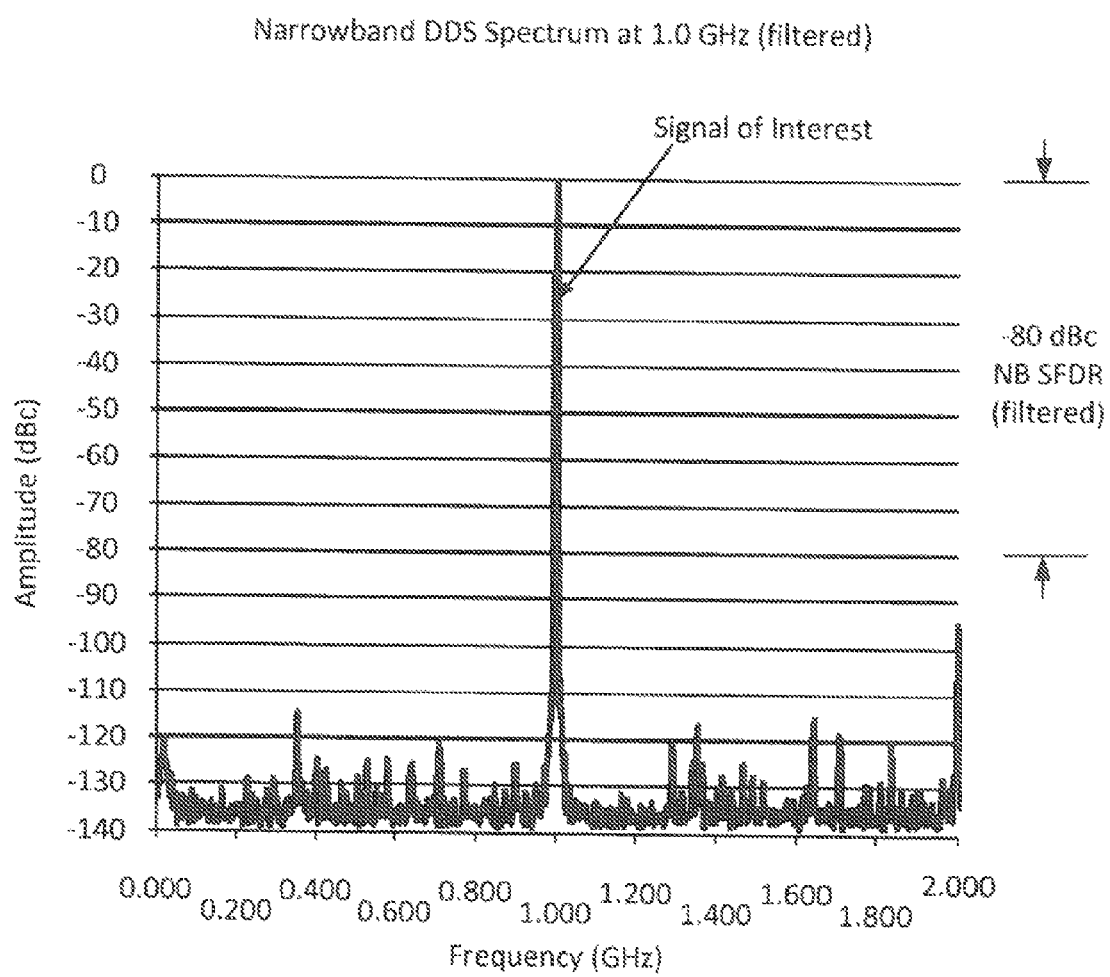

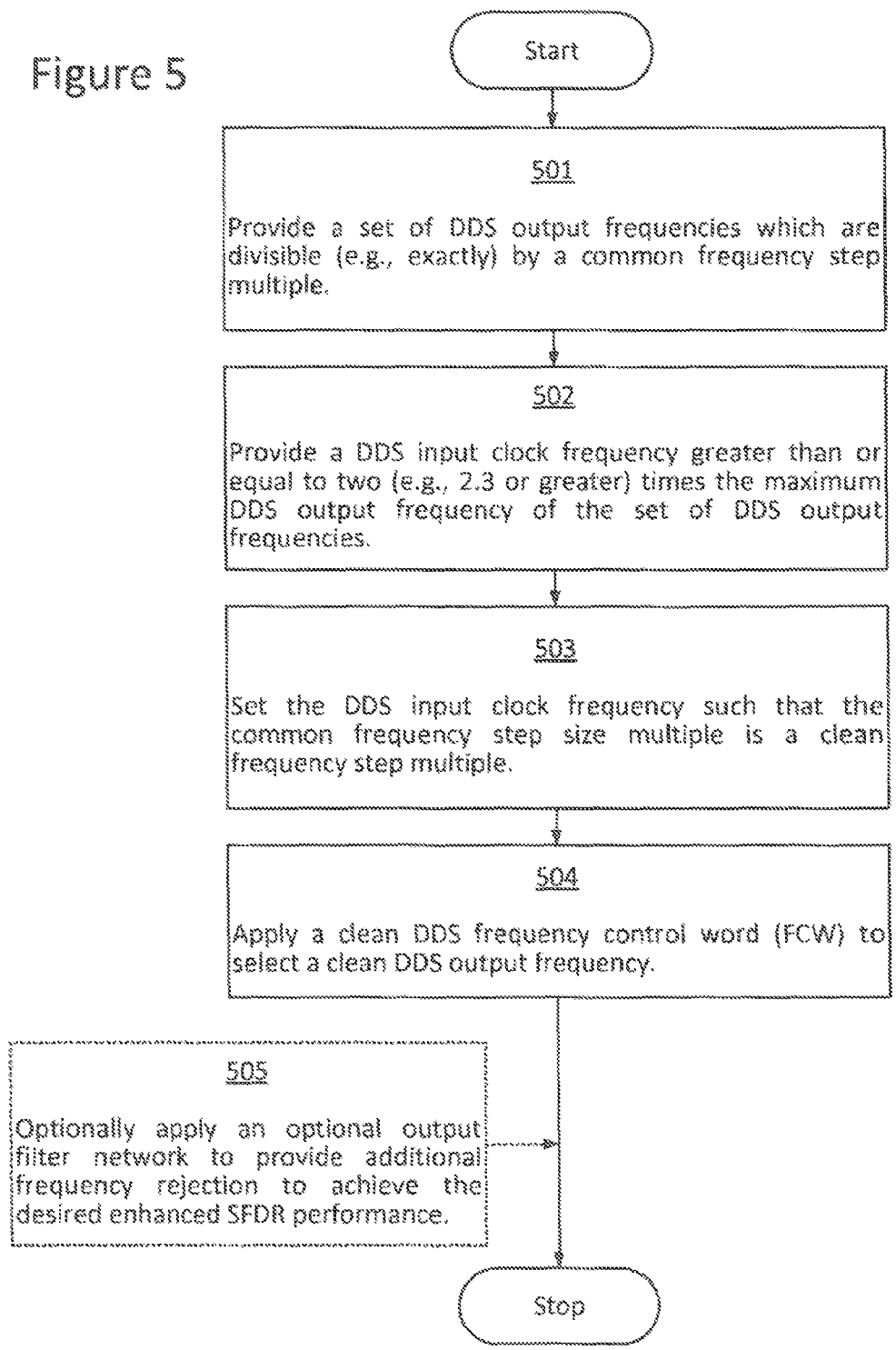

Figure 6A

| [Given] | [Given] | [Select] | [Calc] | | [Calc] |
|---|---|---|---|---|---|
| Required Max DDS Freq | Required Min DDS Freq Step | DDS Clock Freq | DDS Nyquist Freq | 2^N | Potetial Freq Steps |
| 6.5 | 0.5 | 16.0 | 8.0 | 2 | 4.000 |
| 6.5 | 0.5 | 16.0 | 8.0 | 4 | 2.000 |
| 6.5 | 0.5 | 16.0 | 8.0 | 8 | 1.000 |
| 6.5 | 0.5 | 16.0 | 8.0 | 16 | 0.500 |
| 6.5 | 0.5 | 16.0 | 8.0 | 32 | 0.250 |

| [Select] | [Calc] |
|---|---|
| Freq Step Multiple | Possible DDS Freq |
| 1 | 0.500 |
| 2 | 1.000 |
| 3 | 1.500 |
| 4 | 2.000 |
| 5 | 2.500 |
| 6 | 3.000 |
| 7 | 3.500 |
| 8 | 4.000 |
| 9 | 4.500 |
| 10 | 5.000 |
| 11 | 5.500 |
| 12 | 6.000 |
| 13 | 6.500 |
| 14 | 7.000 |
| 15 | 7.500 |
| 16 | 8.000 |

| [Given] | [Select] | |
|---|---|---|
| Max Output Freq | DDS Clock Freq | Nyquist Ratio |
| 6.50 | 16.00 | 2.46 |

Figure 7A

| DDS Frequency Control Word (Decimal) | DDS Frequency Control Word (Hex) | Qty of DDS Frequency Control Word Bits | DDS Input Clock Frequency (GHz) | Desired DDS Output Frequency (GHz) | DDS Output Frequency Error (GHz) | DDS Clean Frequency Step (Decimal) | DDS Clean Frequency Step (GHz) |
|---|---|---|---|---|---|---|---|
| 0 | 000 | 12 | 16.000 | 0.000000 | 0.000000 | n/a | n/a |
| 128 | 080 | 12 | 16.000 | 0.500000 | 0.000000 | 128 | 0.50 |
| 256 | 100 | 12 | 16.000 | 1.000000 | 0.000000 | 256 | 1.00 |
| 384 | 180 | 12 | 16.000 | 1.500000 | 0.000000 | 128 | 0.50 |
| 512 | 200 | 12 | 16.000 | 2.000000 | 0.000000 | 512 | 2.00 |
| 640 | 280 | 12 | 16.000 | 2.500000 | 0.000000 | 128 | 0.50 |
| 768 | 300 | 12 | 16.000 | 3.000000 | 0.000000 | 256 | 1.00 |
| 896 | 380 | 12 | 16.000 | 3.500000 | 0.000000 | 128 | 0.50 |
| 1,024 | 400 | 12 | 16.000 | 4.000000 | 0.000000 | 1024 | 4.00 |
| 1,152 | 480 | 12 | 16.000 | 4.500000 | 0.000000 | 128 | 0.50 |
| 1,280 | 500 | 12 | 16.000 | 5.000000 | 0.000000 | 256 | 1.00 |
| 1,408 | 580 | 12 | 16.000 | 5.500000 | 0.000000 | 128 | 0.50 |
| 1,536 | 600 | 12 | 16.000 | 6.000000 | 0.000000 | 512 | 2.00 |
| 1,664 | 680 | 12 | 16.000 | 6.500000 | 0.000000 | 128 | 0.50 |
| 1,792 | 700 | 12 | 16.000 | 7.000000 | 0.000000 | 256 | 1.00 |
| 1,920 | 780 | 12 | 16.000 | 7.500000 | 0.000000 | 128 | 0.50 |
| 2,048 | 800 | 12 | 16.000 | 8.000000 | 0.000000 | n/a | n/a |

Figure 8A

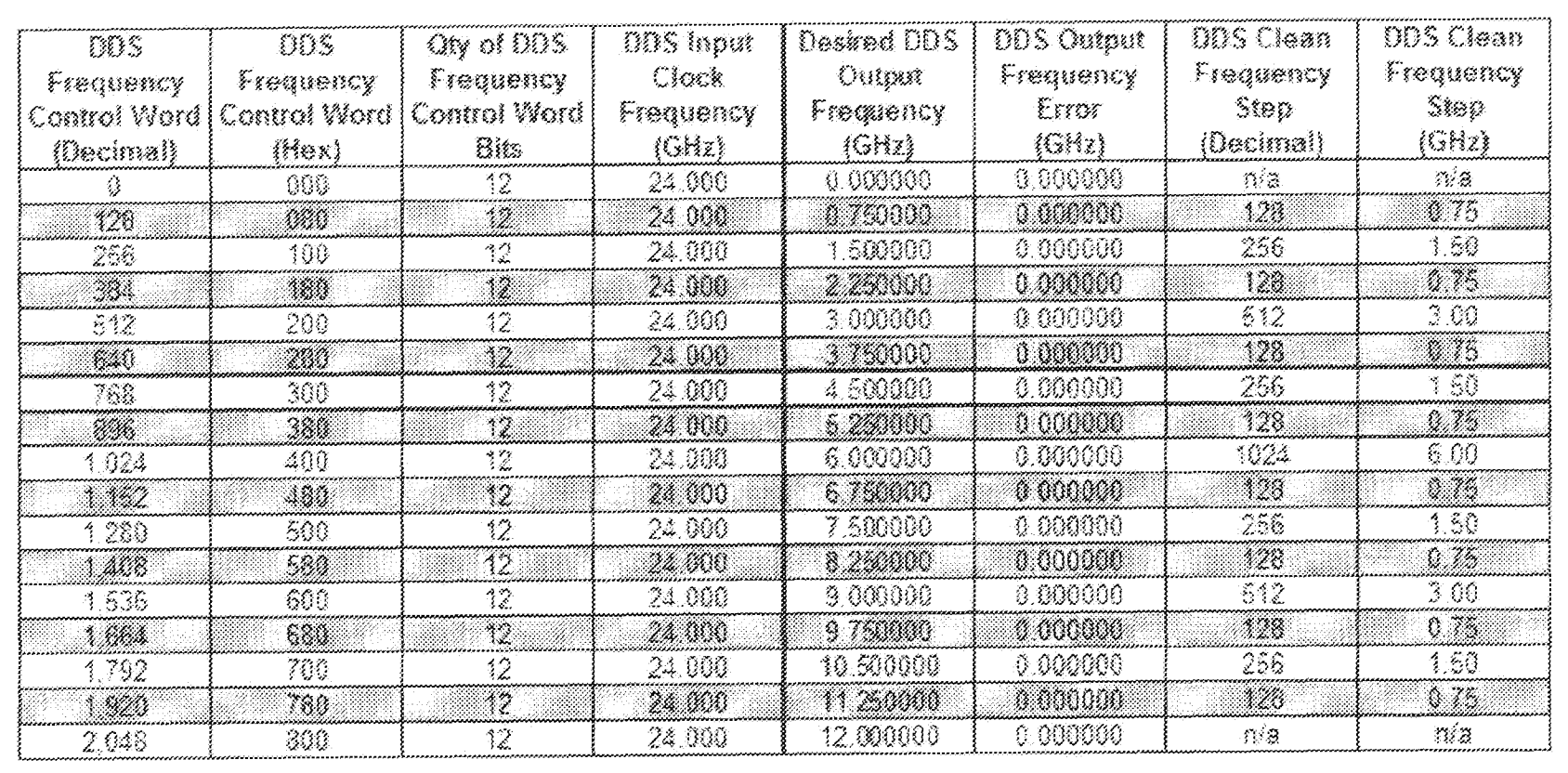

| DDS Frequency Control Word (Decimal) | DDS Frequency Control Word (Hex) | Qty of DDS Frequency Control Word Bits | DDS Input Clock Frequency (GHz) | Desired DDS Output Frequency (GHz) | DDS Output Frequency Error (GHz) | DDS Clean Frequency Step (Decimal) | DDS Clean Frequency Step (GHz) |
|---|---|---|---|---|---|---|---|
| 0 | 000 | 12 | 24.000 | 0.000000 | 0.000000 | n/a | n/a |
| 128 | 080 | 12 | 24.000 | 0.750000 | 0.000000 | 128 | 0.75 |
| 256 | 100 | 12 | 24.000 | 1.500000 | 0.000000 | 256 | 1.50 |
| 384 | 180 | 12 | 24.000 | 2.250000 | 0.000000 | 128 | 0.75 |
| 512 | 200 | 12 | 24.000 | 3.000000 | 0.000000 | 512 | 3.00 |
| 640 | 280 | 12 | 24.000 | 3.750000 | 0.000000 | 128 | 0.75 |
| 768 | 300 | 12 | 24.000 | 4.500000 | 0.000000 | 256 | 1.50 |
| 896 | 380 | 12 | 24.000 | 5.250000 | 0.000000 | 128 | 0.75 |
| 1,024 | 400 | 12 | 24.000 | 6.000000 | 0.000000 | 1024 | 6.00 |
| 1,152 | 480 | 12 | 24.000 | 6.750000 | 0.000000 | 128 | 0.75 |
| 1,280 | 500 | 12 | 24.000 | 7.500000 | 0.000000 | 256 | 1.50 |
| 1,408 | 580 | 12 | 24.000 | 8.250000 | 0.000000 | 128 | 0.75 |
| 1,536 | 600 | 12 | 24.000 | 9.000000 | 0.000000 | 512 | 3.00 |
| 1,664 | 680 | 12 | 24.000 | 9.750000 | 0.000000 | 128 | 0.75 |
| 1,792 | 700 | 12 | 24.000 | 10.500000 | 0.000000 | 256 | 1.50 |
| 1,920 | 780 | 12 | 24.000 | 11.250000 | 0.000000 | 128 | 0.75 |
| 2,048 | 800 | 12 | 24.000 | 12.000000 | 0.000000 | n/a | n/a |

TECHNIQUES FOR ENHANCING SPURIOUS FREE DYNAMIC RANGE PERFORMANCE

CROSS-REFERENCE TO RELATED APPLICATIONS

This application is a divisional of U.S. application Ser. No. 13/621,547 filed Sep. 17, 2012 and claims the benefit of U.S. Provisional Patent Application No. 61/535,858, filed on Sep. 16, 2011, which is herein incorporated by reference in its entirety.

FIELD OF THE DISCLOSURE

The invention relates to signal processing and more particularly to spurious emission performance in a signal system.

BACKGROUND

Signal processing involves a number of non-trivial challenges and particular complications have been faced with respect to spurious emission performance in signal systems.

SUMMARY

One example embodiment of the present invention provides a system including a direct digital synthesizer (DDS) configured to receive an input clock frequency and an anti-aliasing filter (AAF) operatively coupled with the DDS, wherein the system provides an output signal having a wideband spurious free dynamic range (SFDR) of about −40 dBc or better and/or a narrowband SFDR of about −70 dBc or better. In some cases, the input clock frequency is in the range of about 10 MHz to 40 GHz. In some cases, the output signal has a frequency in the range of about 1.0 to 6.5 GHz and is adjustable in 0.5 GHz increments. In some instances, the system further includes an amplifier operatively coupled with the AAF. In some instances, the system further includes an output filter network operatively coupled with the AAF, the output filter network including a plurality of switches and a plurality of filters operatively coupled with the plurality of switches. In some such example cases, the plurality of switches includes at least one broadband, non-reflective switch, and the plurality of filters includes at least one band-pass filter. In some other example cases, the output filter network includes a tracking filter network having one or more tracking filters. In some instances, an electronic device including the system is provided. In some such instances, the electronic device includes at least one of a transmitter, a receiver, an up-converter, a down-converter, a power amplifier, and/or an oscillator.

Another example embodiment of the present invention provides a method of enhancing spurious free dynamic range (SFDR) performance in a direct digital synthesizer (DDS)-based system, the method including providing a set of DDS output frequencies which are divisible by a common frequency step multiple, providing a DDS input clock frequency greater than or equal to two times a maximum DDS output frequency, setting the DDS input clock frequency such that the common frequency step multiple is a clean frequency step multiple, and applying a clean DDS frequency control word (FCW) to select a clean DDS output frequency. In some cases, the method further includes applying an output filter network to provide additional frequency rejection. In some instances, the clean frequency step multiple is determined via the following relationship:

$$\frac{DDS \text{ Nyquist Frequency}}{2^n},$$

where n is 1, 2, 3 . . . and where $$DDS \text{ Nyquist Frequency} = \frac{DDS \text{ Clock Frequency}}{2}.$$

In some instances, the clean DDS FCW is calculated via the following equation:

$$DDS \ FCW = \frac{DDS \text{ Output Frequency}}{DDS \text{ Clock Frequency}} \times 2^{Number \ of \ FCW \ Bits}.$$

In some cases, wideband SFDR performance is about −40 dBc or better and/or narrowband SFDR performance is about −70 dBc or better. In some other cases, wideband and narrowband SFDR performance are about −70 dBc or better. In some example instances, at least a portion of the method is performed in a system on chip (SOC), in a circuit on a printed circuit board (PCB), and/or in an integrated circuit (IC). In some other example instances, at least a portion of the method is performed in at least one of a transmitter, a receiver, an up-converter, a down-converter, a power amplifier, and/or an oscillator.

Another example embodiment of the present invention provides a system including a direct digital synthesizer (DDS) configured to receive an input clock frequency and to provide a first output signal, an anti-aliasing filter (AAF) configured to receive the first output signal and to provide a filtered second output signal, an amplifier configured to receive the filtered second output signal and to provide an amplified third output signal, and an output filter network configured to receive the amplified third output signal and to provide a filtered fourth output signal having a wideband and narrowband spurious free dynamic range (SFDR) of about −70 dBc or better. In some cases, the DDS includes a numerically-controlled oscillator (NCO) including a phase accumulator and a digital to analog converter (DAC) operatively coupled with the NCO. In some example cases, the input clock frequency is in the range of about 10 MHz to 40 GHz. In some example instances, the filtered fourth output signal has a frequency in the range of about 1.0 to 6.5 GHz and is adjustable in 0.5 GHz increments. In one specific example case, the AAF includes a 6.5 GHz low-pass filter. In another specific example case, the amplifier includes a wideband low-noise amplifier configured to provide +12 dB gain and +14 dBm of output power at 1 dB gain compression. In some cases, the output filter network includes a first broadband, non-reflective switch configured to receive the amplified output signal of the amplifier, a first band-pass filter operatively coupled with the first broadband, non-reflective switch and configured to filter frequencies in the range of about 1 to 2 GHz, a second broadband, non-reflective switch operatively coupled with the first broadband, non-reflective switch, a second band-pass filter operatively coupled with the second broadband, non-reflective switch and configured to filter frequencies in the range of about 2 to 4 GHz, a third band-pass filter operatively coupled with the second broadband, non-reflective switch and configured to filter frequencies in the range of about 4 to 8 GHz, a third broadband, non-reflective switch operatively coupled with the second band-pass filter and the third band-pass filter, and a fourth broadband, non-reflective switch operatively coupled with the third broadband, non-reflective switch and the first band-pass filter. In some instances, an electronic device including the system is provided. In some such instances, the electronic device includes at least one of a transmitter, a receiver, an up-converter, a down-converter, a power amplifier, and/or an oscillator.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

BRIEF DESCRIPTION OF THE DRAWINGS

FIG. 3A illustrates a wideband view of an unfiltered DDS spectrum at 1.0 GHz, in accordance with an embodiment of the present invention.

FIG. 3B illustrates a narrowband view of the spectrum of FIG. 3A.

FIG. 4A illustrates a wideband view of a filtered DDS spectrum at 1.0 GHz, in accordance with an embodiment of the present invention.

FIG. 4B illustrates a narrowband view of the spectrum of FIG. 4A.

FIG. 5 is a flow diagram illustrating an example method of enhancing narrowband SFDR performance by use of a frequency plan including clean frequencies, in accordance with an embodiment of the present invention.

FIGS. 6A-6C illustrate an example set of calculations performed in determining how to set the DDS clock input frequency to ensure that all the DDS clean frequency criteria are satisfied, in accordance with an embodiment of the present invention.

FIG. 7A is a table of clean frequency parameters for a DDS frequency plan having a clean frequency step size of 0.5 GHz, in accordance with an embodiment of the present invention.

FIG. 8A is a table of clean frequency parameters for a DDS frequency plan having a clean frequency step size of 0.75 GHz, in accordance with an embodiment of the present invention.

Figure 1:
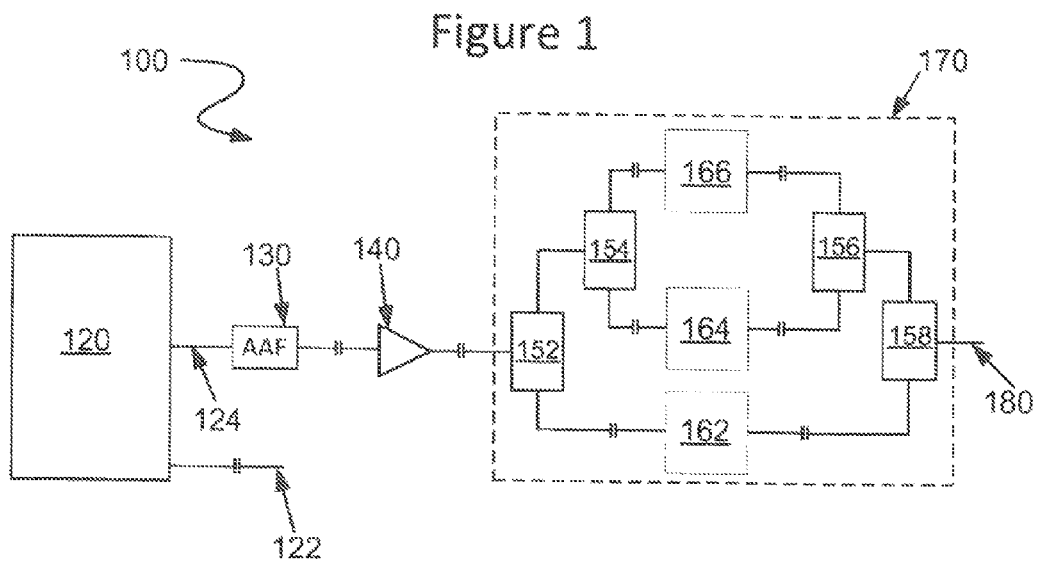
FIG. 1 is a schematic view of a system configured in accordance with an embodiment of the present invention.

These and other features of the present embodiments will be understood better by reading the following detailed description, taken together with the figures herein described. The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Techniques and architecture are disclosed for improving spurious performance in a signal generator/system. The disclosed techniques/architecture can be used, for example, to enhance/improve the wideband and/or narrowband spurious free dynamic range (SFDR) between a given carrier signal and spurious signals. In some example instances, wideband and/or narrowband SFDR may be improved to about −40 dBc or better. In some other example instances, wideband and/or narrowband SFDR may be improved to about −70 dBc or better. The disclosed techniques/architecture can be implemented in a wide variety of signal generators/systems, such as a direct digital synthesizer (DDS)-based system, and over a wide range of input clock frequencies (e.g., in the range of about 10 MHz to 40 GHz, or higher). Numerous configurations and variations will be apparent in light of this disclosure.

General Overview

As previously indicated, there are a number of non-trivial issues that can arise which complicate signal processing. For instance, one non-trivial issue pertains to providing a signal generator/system which exhibits suitable spurious emission performance (e.g., a sufficiently high spurious free dynamic range or SFDR) for a given application. SFDR generally refers to the ratio of the fundamental signal to the strongest spurious signal in the output, for example, of a signal converter. Generally. SFDR is defined as the ratio of the RMS value of the carrier frequency (maximum signal component) at the input of the Analog to Digital Converter (ADC) or Digital to Analog Converter (DAC) to the RMS value of the next largest noise or harmonic distortion component (referred to as a spurious emission or a spur) at its output. Also, SFDR is typically measured in terms of decibels relative to the carrier (dBc), which represents the power ratio of a given signal to a carrier signal, expressed in decibels.

A spurious emission or spur is any frequency not deliberately created or transmitted, especially in a device/system which normally creates other frequencies. Some examples of spurious emissions may include, but are not necessarily limited to: (1) harmonic emissions; (2) parasitic emissions; (3) intermodulation products; (4) frequency conversion products; and/or (5) out-of-band emissions.

In a signal system which utilizes, for example, a frequency synthesizer (e.g., a direct digital synthesizer or DDS), these complications may be compounded by the degraded spurious emission performance inherent to the frequency synthesizer, which cannot normally be corrected or improved with filtering. As will be appreciated, this may be of particular concern when the DDS is operating at high frequencies (e.g., 1 GHz or higher). Such poor close-in spurious emission performance prevents or otherwise discourages use of DDS technology, for instance, in devices such as a radio frequency (RF) receiver local oscillator (LO). In part, this is because close-in LO spurs translate directly onto a receiver's intermediate frequency (IF), cannot be removed with filtering, and degrade receiver sensitivity.

Thus, and in accordance with an embodiment of the present invention, techniques and architecture are disclosed for improving close-in spurious emission performance in a signal generator/system, such as by enhancing/improving spurious free dynamic range (SFDR). In accordance with an embodiment, the disclosed techniques can be used to enhance/improve the spurious emission performance, for example, of a direct digital synthesizer (DDS)-based system. To that end, the disclosed techniques can be used, in accordance with an embodiment, to provide a frequency plan which includes a set of particularly selected DDS tuning steps/frequencies (hereinafter referred to as "clean" frequencies) which allow for operation of the DDS with significantly improved spurious emission performance. In some such instances, the frequency plan may: (1) reduce the total quantity of DDS output spurs; and/or (2) alter the DDS output spurs such that they are spaced sufficiently far from the carrier signal to be filtered.

In some cases, the clean frequencies may include frequencies occurring at specific sub-multiples of the DDS reference frequency, and, in one specific example embodiment, these clean frequencies may correspond, for example, directly to DDS tuning steps where the DDS phase accumulator mathematically has zero phase error as the DDS traverses its states. As a result of designing and using a DDS in zero-phase accumulator states, narrowband (close-in) spurious emission performance may be improved, for example, to about −70 dBc or better, in accordance with an embodiment. In some cases, and in accordance with an embodiment, clean frequency operation may keep unwanted spurs removed from the DDS output frequency carrier so that they can be removed by filtering to improve (e.g., in some cases, more than double) wideband SFDR performance.

As will be appreciated in light of this disclosure, and in accordance with an embodiment, the disclosed techniques/architecture can be used for high and/or low input frequencies alike (e.g., in the range of about 10 MHz to 40 GHz, or higher) and thus may be used in any of a wide variety of applications, including, but not limited to: (1) transmitting electronics (e.g., an up-converter/transmitter); (2) receiving electronics (e.g., a down-converter/receiver); (3) amplifying electronics (e.g., a power amplifier); and/or (4) applications where there is a desire to implement an oscillator or other signal source. In one specific example embodiment, the disclosed techniques can be used to allow for miniaturization of a frequency converter local oscillator (LO) system while maintaining improved spurious emission performance. In another specific example embodiment, the disclosed techniques can be used in a DDS-based radio frequency (RF) receiver to achieve improved/enhanced spurious emission performance. Other suitable uses of one or more embodiments of the present invention will depend on a given application and will be apparent in light of this disclosure.

In some cases, the disclosed techniques/architecture can be used, in accordance with an embodiment, to provide DDS-based devices/systems having a relatively small footprint/profile (e.g., having an area in the range of about 1 to 2 $in^2$ or less). Also, in some instances, reductions in device/system cost may be realized. Furthermore, and in accordance with an embodiment, the disclosed techniques/architecture can be used in some example instances to provide faster-switching, more physically robust DDS-based hardware solutions as compared, for example, with existing DDS and non-DDS solutions.

System Architecture and Operation

FIG. 1 is a schematic view of a system 100 configured in accordance with an embodiment of the present invention. As can be seen, system 100 may include, for example, a direct digital synthesizer (DDS) 120, an anti-aliasing filter (AAF) 130, an optional amplifier 140, and an optional filter network 170. In some cases, one or more portions of system 100 may be configured as stand-alone components or may be incorporated/integrated into a circuit including one or more other components of system 100. In some example embodiments, system 100 may be configured as a system-on-chip (SOC) or chip set, while in some other example embodiments system 100 may be configured as discrete components populated on a printed circuit board (PCB). In one specific example embodiment, system 100 may be configured as a high SFDR DDS circuit, where wideband SFDR is about −40 dBc or better and/or narrowband SFDR is about −70 dBc or better. As will be appreciated in light of this disclosure, system 100 may include additional, fewer, and/or different elements or components from those here described, and the claimed invention is not intended to be limited to any particular system/device configurations, but can be used with numerous configurations in numerous applications. In a more general sense, and in accordance with an embodiment, any system that employs a DDS can benefit from using the disclosed techniques to improve/enhance SFDR performance (e.g., by adopting a frequency plan as described herein).

In accordance with an embodiment, DDS 120 can be, in whole or in part: (1) a standard DDS device; (2) a custom DDS device; and/or (3) any other device/component used for creating arbitrary waveforms, for example, from a single, fixed-frequency reference clock. Furthermore, and in accordance with an embodiment of the present invention, a number of factors may be considered in choosing a suitable DDS 120 for implementation in system 100, including, but not limited to: (1) desired frequency range; (2) clock rate; (3) input clock power; (4) transmit frequency resolution; (5) receive frequency resolution; (6) wideband SFDR; (7) narrowband SFDR; (8) switching time; (9) power consumption; (10) output power; (11) phase noise; and/or (12) time jitter. In some embodiments, DDS 120 may be configured as a stand-alone DDS source. In some other embodiments, DDS 120 may be configured as discrete components which have been operatively coupled with one another, such as, but not limited to: (1) a frequency reference; (2) a numerically-controlled oscillator (NCO); and/or (3) a digital to analog converter (DAC). As will be appreciated in light of this disclosure, and in accordance with an embodiment, a wide range of suitable phase accumulator and DAC resolutions (e.g., ranging from high bit to low bit) can be implemented. For instance, in one specific example embodiment, DDS 120 may include, in part, a NCO having a 14 bit phase accumulator and/or a 6 bit DAC. However, the claimed invention is not so limited, as in some other example embodiments, phase accumulators with more or less than 14 bits and/or DACs with more or less than 6 bits may be utilized. Other suitable configurations, performance parameters, and/or capabilities of DDS 120 will depend on a given application and will be apparent in light of this disclosure.

In accordance with an embodiment, DDS 120 may be configured to receive a frequency reference from an input clock frequency 122 and to output or otherwise provide an output frequency 124. Input clock frequency 122 may be in the range of kilohertz (kHz), megahertz (MHz), gigahertz (GHz), or other (as desired for a given application). For example, in some embodiments, input clock frequency 122 may be in the range of about 10 MHz to 40 GHz or greater, and, in one specific example embodiment, may be about or equal to 16 GHz. However, some other embodiments may employ lower or higher input clock frequencies 122 depending on a number of factors such as the desired output frequency 124 and/or other DDS 120 capabilities.

Output frequency 124 may be provided by DDS 120, in accordance with an embodiment, to a downstream anti-aliasing filter (AAF) 130. In general, AAF 130 can be any type of device capable of attenuating signal content outside a desired bandwidth. AAF 130 may be operatively coupled to one or more other components of system 100 including, but not limited to, DDS 120 (e.g., to filter the output frequency 124 thereof) and/or optional amplifier 140 (discussed below). In some cases, AAF 130 can be any type of device (e.g., low-pass filter; high-pass filter; band-pass filter; band-stop filter; a filter network; etc.) which passes the one or more desired DDS output signals 124 but which attenuates undesired alias band spurs. In one specific example embodiment, AAF 130 may be a 6.5 GHz low-pass filter. In some other cases, such as where both lower and higher frequencies are to be filtered or otherwise attenuated, AAF 130 may be a band-pass filter. Other suitable types/configurations for AAF 130 will depend on a given application and will be apparent in light of this disclosure.

As can be seen from FIG. 1, after passing through AAF 130, the signal may be provided downstream, in some instances, to an optional amplifier 140. In general, amplifier 140 can be any type of device capable of increasing the power and/or level of a signal, the function and capability of which can be selected based on the demands of the target application. In some instances when amplifier 140 is implemented in system 100, such amplifier 140 may be operatively coupled to one or more other components of system 100 including, but not limited to, DDS 120, AAF 130 and/or optional filter network 170 (discussed below). Thus, and in accordance with an embodiment, optional amplifier 140 may help, in some example cases, to increase the output signal level and/or improve the output signal-to-noise ratio (SNR) performance of system 100 (and/or a given component thereof). In some embodiments, optional amplifier 140 may be a wideband low-noise amplifier (e.g., configured to provide +12 dB gain and +14 dBm of output power at 1 dB gain compression). As will be appreciated in light of this disclosure, any number of filtering and amplifier characteristics may be appropriate depending on the target application, and the claimed invention is not intended to be limited to the particular implementation details of any one scheme.

As can further be seen from FIG. 1, in some instances, system 100 may include an optional filter network 170 operatively coupled with one or more of its components (e.g., AAF 130, amplifier 140, etc.). In some embodiments, filter network 170 may include, in part, an arrangement of switches and/or filters, discussed below. As will be appreciated in light of this disclosure, filter network 170 can be implemented, in some cases, as an integrated circuit (IC) or a portion of an overall IC of system 100. In some other cases, filter network 170 can be implemented with discrete components populated, for example, on a printed circuit board (PCB), or as a printed filter on/within a PCB, or as a stand-alone filter. In general, optional filter network 170 can be customized for a given target application (e.g., can be configured in any desired form, using any filtering technology and/or packaging techniques which provide the desired filtering capabilities).

In accordance with an embodiment, optional filter network 170 may include one or more switches, filters, and/or filter elements. For instance, as can be seen from the example embodiment of FIG. 1, in some cases filter network 170 may include one or more switches, such as switches 152, 154, 156, and/or 158. In one specific example case, one or more of switches 152, 154, 156, and/or 158 may be, for instance, a broadband non-reflective switch. Other suitable types/configurations for the one or more switches 152, 154, 156, and/or 158 of optional filter network 170 will depend on a given application and will be apparent in light of this disclosure.

As can further be seen from the example embodiment of FIG. 1, in some cases filter network 170 may include one or more filters, such as filters 162, 164, and/or 166. In one specific example case, one or more of filters 162, 164, and/or 166 may be, for instance, a band-pass filter or any type of device that passes frequencies within a certain range while attenuating frequencies outside that range. In some specific example instances, one or more filters 162, 164, and/or 166 may be configured to pass frequencies in ranges including, but not limited to: (1) about 1 to 2 GHz; (2) about 2 to 4 GHz; and/or (3) about 4 to 8 GHz. In one specific example embodiment, optional filter network 170 may be configured as a tracking filter network including, for instance: (1) a tracking band-pass filter 162 configured to filter frequencies in the range of about 1 to 2 GHz; (2) a tracking band-pass filter 164 configured to filter frequencies in the range of about 2 to 4 GHz; and (3) a tracking band-pass filter 166 configured to filter frequencies in the range of about 4 to 8 GHz. However, the claimed invention is not so limited, and other suitable types/configurations for optional filter network 170 (e.g., filters 162, 164, and/or 166, etc.) will depend on a given application and will be apparent in light of this disclosure.

As can be seen from FIG. 1, system 100 may be configured to provide an output signal 180. Output signal 180 may be provided downstream of any of AAF 130, optional amplifier 140, and/or optional filter network 170. In some embodiments, system 100 may be configured to provide a range of output signals 180. In one example embodiment, a given output signal 180 may have a frequency in the range of about 1.0 to 6.5 GHz and may be adjustable, for example, in 0.5 GHz increments. However, other desired frequency ranges and/or adjustment increments for a given output signal 180 can be provided, depending on the target application. As discussed below, in some embodiments, the one or more output signals 180 of system 100 may exhibit, for example: (1) wideband SFDR of about −35 dBc or better; and/or (2) narrowband SFDR of about −70 dBc or better. In some cases, an optional filter network 170 (and/or other suitable filtration), when included, may help to extend wideband SFDR performance to about −70 dBc or better, in accordance with an embodiment.

Furthermore, and in accordance with an embodiment, the output signal 180 may be a sufficiently clean response signal which provides greater sensitivity and/or less interference and degradation of any electronics (e.g., a receiver, a transmitter, etc.) operatively coupled thereto. For example, output signal 180 may be utilized in any number of electronics, including, but not limited to: (1) an up-converter (e.g., transmitter); and/or (2) a down-converter (e.g., receiver). In some embodiments, system 100 may be configured to generate an output signal 180 which is a LO signal, and as such may be built in as part of a receiver.

As previously noted, and in accordance with an embodiment, the disclosed techniques can be used to provide a system 100 which is relatively small in size (e.g., small footprint, small profile, etc.). For instance, in one specific example embodiment, system 100 may have an area in the range of about 1 to 2 in$^2$. Also, as previously noted, system 100 can be implemented on-chip, on printed circuit board (PCB), or otherwise variously integrated.

As will be appreciated, in some cases system 100 may be configured to operate at frequencies which are too high to permit implementation (e.g., fabrication, formation, etc.) thereof, for example, on a PCB. Thus, to address this issue, and in accordance with an embodiment, system 100 may be implemented, for example, with a metal chassis, a channelized enclosure, and/or any other packaging which provides characteristics such as, but not limited to: (1) high isolation; (2) sufficient grounding; (3) narrow, channelized walls to prevent re-radiation of signal; and/or (4) various implementations, connections, and arrangements of internal transmission lines. In some embodiments, system 100 may be configured in a die form. In some instances, system 100 may be implemented using, for example, circuit card packaging techniques, microwave packaging techniques, and/or integration with a chip. Numerous packaging and interconnection media can be used to operatively couple the various functional portions/components of system 100.

Frequency Plan Design and Use

As previously noted, adoption of a frequency plan including a carefully chosen set of DDS tuning frequencies may significantly improve spurious performance thereof. In some embodiments, a frequency plan may include frequencies such that, for full sub-band modes of operation, the DDS is configured to operate on clean frequencies only. Such a frequency plan may include only clean frequencies, thus helping to keep spurious signals separate and distinct from the carrier signal. This, in turn, may permit easier filtering of unwanted signals. Such filtration may improve whatever system is operatively coupled to and/or inclusive of such DDS. In some embodiments, the improved system may include, in part, a receiver.

In some embodiments, the DDS phase accumulator size, DDS look-up ROM size, and/or DDS clock frequency may be selected such that there is no phase accumulator remainder on the LO frequencies that are required for frequency translation in the tuner, which may yield a significantly cleaner LO spectrum.

In some instances in which the DDS frequencies are sub-multiples of the Nyquist frequency, the DDS may function like a frequency divider and may create spurs that are harmonically related to the DDS fundamental frequency. In such cases, these spurs may be similar to those generated, for example, by any amplifier and may be removed with a sub-octave filtering network.

In some instances in which the DDS frequencies are offset from the Nyquist frequency by an exact modulo 2 sub-multiple of the Nyquist frequency, the DDS spurs may be offset from the DDS fundamental frequency by the sub-multiple step size. These spurs may be similar to those generated, for example, by a comb generator and may be removed by a filter with sufficient rejection at the spur offset frequencies.

If the clean frequency step multiple is $$\frac{F_{Nyquist}}{2^1}$$

(for simplicity hereinafter, 'Multiple #1'), then for a Nyquist frequency of 8.0 GHz, Multiple #1 equals 4.0 GHz. If the clean frequency step multiple is $$\frac{F_{Nyquist}}{2^2}$$

(hereinafter, 'Multiple #2'), then for a Nyquist frequency of 8.0 GHz, Multiple #2 equals 2.0 GHz. If the clean frequency step multiple is $$\frac{F_{Nyquist}}{2^3}$$

(hereinafter, 'Multiple #3'), then for a Nyquist frequency of 8.0 GHz, Multiple #3 equals 1.0 GHz. If the clean frequency step multiple is $$\frac{F_{Nyquist}}{2^4}$$

(hereinafter, 'Multiple #4'), then for a Nyquist frequency of 8.0 GHz, Multiple #4 equals 0.5 GHz. This pattern/relationship may be expressed as $$\frac{F_{Nyquist}}{2^n},$$

where n is limited by the number of FCW bits.

For all clean frequency Multiple #1 steps, the output spectrum should have no phase or amplitude quantization spurs at frequency offsets $$< \pm \frac{F_{Nyquist}}{2^1}.$$

For all clean frequency Multiple #2 steps, the output spectrum should have no phase or amplitude quantization spurs at frequency offsets $$< \pm \frac{F_{Nyquist}}{2^2}.$$

For all clean frequency Multiple #3 steps, the output spectrum should have no phase or amplitude quantization spurs at frequency offsets $$< \pm \frac{F_{Nyquist}}{2^3}.$$

For all clean frequency Multiple #4 steps, the output spectrum should have no phase or amplitude quantization spurs at frequency offsets $$< \pm \frac{F_{Nyquist}}{2^4}.$$

Figure 2:
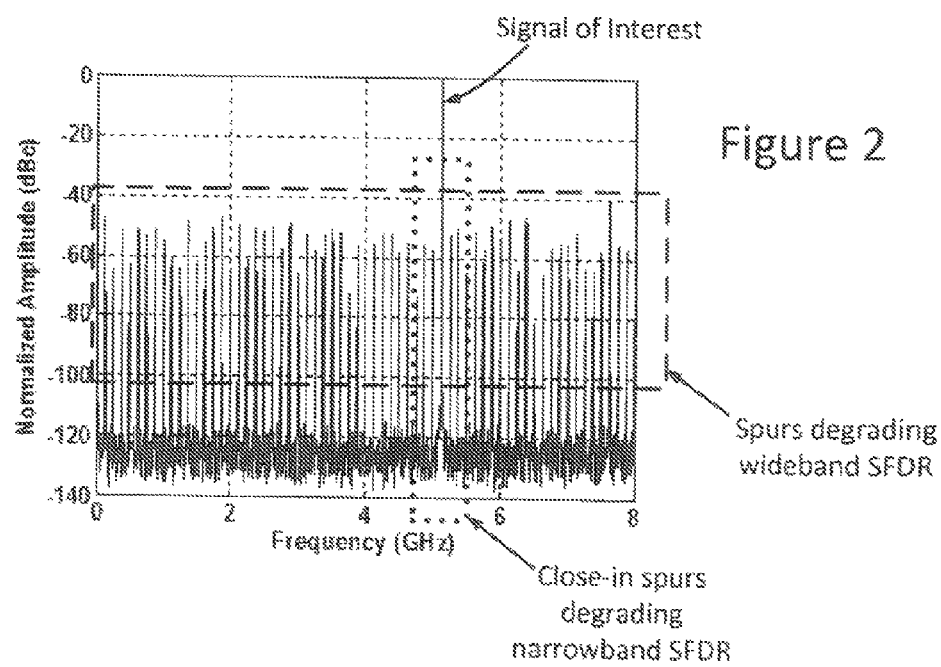
FIG. 2 illustrates an unfiltered DDS output spectrum produced when operating at an arbitrary frequency.

FIG. 2 illustrates an unfiltered DDS output spectrum produced when operating at an arbitrary frequency. As can be seen, the signal of interest is surrounded by a large number of spurs (generally within the dashed box in the figure) which degrade wideband SFDR performance. Also, the close-in spurs (e.g., those spurs most proximate the signal of interest, generally within the dotted box in the figure) degrade narrowband SFDR performance. Thus, as will be appreciated in light of this disclosure, this output spectrum resulting from use of an arbitrary frequency generally is not amenable to filtering or other refinement for practical use. Conversely, the output spectrum represented, for example, in FIGS. 3A and 3B (discussed below) resulting from use of a clean frequency chosen from an adopted frequency plan, may be cleaner, more regular, and/or more predictable, thus making it a suitable candidate for filtering or other refinement for practical use, and may be further filtered and/or improved as shown in FIGS. 4A and 4B (also discussed below).

FIGS. 3A and 3B illustrate a wideband view and a narrowband view, respectively, of an unfiltered DDS spectrum at 1.0 GHz, in accordance with an embodiment of the present invention. As can be seen from this specific example case, without optionally implementing additional filtering, the wideband SFDR may be approximately −35 dBc. As can further be seen, distinct spurs occur at regular 1.0 GHz intervals, with low spurious emissions within ±<1 GHz of the fundamental frequency (e.g., signal of interest) and a large spur at ±1 GHz. As can be seen with reference to FIG. 3B, and in accordance with an embodiment, this may help to improve close-in spur performance and thus narrowband SFDR (e.g., to approximately −75 dBc).

FIGS. 4A and 4B illustrate a wideband view and a narrowband view, respectively, of a filtered DDS spectrum at 1.0 GHz, in accordance with an embodiment of the present invention. As can be seen from this specific example case, the narrowband SFDR is approximately −75 dBc and with optionally implementing additional filtering, the wideband SFDR may be improved to approximately −80 dBc.

As will be appreciated in light of this disclosure, and in accordance with an embodiment, the disclosed techniques can be used to provide an output signal having a given desired SFDR (e.g., wideband and/or narrowband) for a given target application (e.g., about −35 dBc or better; about −40 dBc or better; about −45 dBc or better; about −50 dBc or better about −55 dBc or better; about −60 dBc or better; about −65 dBc or better; about −70 dBc or better; about −75 dBc or better; about −80 dBc or better; etc.). As will be appreciated in light of this disclosure, in some cases the SFDR performance achievable with a given system may depend, in part or in whole, on the configuration of the DDS and/or any optional amplifying and/or filtering elements implemented.

In accordance with an embodiment, it may be desirable, for example, to select the DDS clock frequency such that: (1) the desired clean frequency step size is achieved; (2) the desired maximum DDS output frequency is achieved; and (3) the desired Nyquist ratio $$\frac{F_{Clock}}{F_{DDS}} \geq 2$$

(e.g., about 2.3 or greater) is achieved. As will be appreciated in light of this disclosure, and in accordance with an embodiment, setting the Nyquist ratio to greater than or equal to about 2 may help to facilitate filtering of DDS alias frequencies, for instance, by allowing for a transition region such that an anti-aliasing filter may be implemented. As will be further appreciated, and in accordance with an embodiment, it may be desirable in some instances to fulfill all three of the aforementioned conditions.

Also, in some example instances, it may be desirable to design a DDS-based system with parameters including: (1) DDS frequencies in the range of about 1.0 to 6.5 GHz; (2) DDS frequency step size of about 0.5 GHz; (3) DDS clock frequency ≤18.0 GHz; and (4) SFDR ≥−75 dBc.

FIG. 5 is a flow diagram illustrating an example method of enhancing narrowband SFDR performance by use of a frequency plan including clean frequencies, in accordance with an embodiment of the present invention. The method may begin, as in block 501, with providing a set of DDS output frequencies which are divisible (e.g., evenly or otherwise within an acceptable tolerance) by a common frequency step multiple. In some cases, the set of DDS output frequencies may be or otherwise include the DDS output frequencies which are required or otherwise desired, for example, for a DDS-based system. In some embodiments, if the required DDS output frequencies are superimposed onto a single plot, it may look like a comb of frequencies, all divisible by a common frequency step size multiple. As will be appreciated in light of this disclosure, and in accordance with an embodiment, it may be desirable to ensure that all of the DDS frequencies are evenly divisible (e.g., such that the result of division is an integer) by a common frequency step size multiple, and not just spaced by a common step size multiple. Also, it may be desirable to configure the system for the largest common step multiple possible for case of spurious filter rejection requirements in the output filter network.

The method may proceed, as in block 502, with providing a DDS input clock frequency greater than or equal to about two (e.g., 2.3 or greater, in some specific embodiments) times the maximum DDS output frequency of the set of DDS output frequencies. In some cases, the DDS itself may be configured to be amenable to this range of input clock frequencies. As will be appreciated in light of this disclosure, a DDS with a minimum input clock frequency, for example, of 2.3 times the maximum DDS output frequency may be desired to maintain margin to the Nyquist bound. This margin may assist with ensuring that the DDS AAF requirements are achievable, filtering out unwanted frequencies above the Nyquist frequency. In some embodiments, the Nyquist frequency may be 8.0 GHz, and thus the DDS output frequency would be chosen below such value to allow the AAF to filter frequencies above such value.

Next, the method may continue, as in block 503, with setting the DDS input clock frequency such that the common frequency step size multiple is a clean frequency step multiple. In accordance with an embodiment, a clean frequency step may be, for instance, a frequency step that is a modulo 2 sub-multiple of the DDS Nyquist frequency and may be determined, for example, via the following relationship:

$$\frac{DDS \text{ Nyquist Frequency}}{2^n},$$

where n=1, 2, 3, . . . and where $$DDS\ Nyquist\ Frequency = \frac{DDS\ Clock\ Frequency}{2}.$$

To identify a clean frequency, and in accordance with an embodiment of the present invention, several criteria will be met simultaneously: (1) each of the required or otherwise desired DDS output frequencies will be suitably divisible (e.g., evenly, so as to produce an integer value) by the minimum DDS clean frequency step multiple; (2) the DDS Nyquist frequency divided by the minimum DDS clean frequency step multiple will be an exact power of 2 (e.g., $2^1$, $2^2$, . . . , $2^n$); and (3) the DDS clock frequency will be greater than 2 (e.g., 2.3 or greater) times the maximum DDS output frequency. When these clean frequency criteria are met, the DDS output frequency spectrum will take on clean frequency spurious performance characteristics that are a function of the selected DDS output frequency step. For example, if the selected DDS output frequency step is divisible by 4.0 GHz, then the DDS output will have a clean output spectrum up to ±<4.0 GHz from its carrier. If the selected DDS output frequency step is divisible by 2.0 GHz, then the DDS output will have a clean output spectrum up to ±<2.0 GHz from its carrier. If the selected DDS output frequency step is divisible by 1.0 GHz, then the DDS output will have a clean output spectrum up to ±<1.0 GHz from its carrier. If the selected DDS output frequency step is divisible by 0.5 GHz, then the DDS output will have a clean output spectrum up to ±<0.5 GHz from its carrier. For DDS output frequencies divisible by multiple clean frequency steps, the largest step determines the DDS output spectral characteristics. Once the clean frequency criteria are met, the DDS will exhibit the described behavior for all frequency step multiples that are an exact power of 2, for example.

Thereafter, the method may proceed, as in block 504, with applying a clean DDS frequency control word (FCW) to select one of the clean DDS output frequencies. In some embodiments, the clean frequency DDS FCW may be calculated for each output frequency, for example, via the following equation:

$$DDS\ FCW = \frac{DDS\ Output\ Frequency}{DDS\ Clock\ Frequency} \times 2^{Number\ of\ FCW\ Bits}.$$

In accordance with an embodiment of the present invention, the clean FCWs will be multiples of (e.g., evenly divisible by) the minimum DDS clean frequency step size. There will be no mathematical frequency error when using the DDS output FCW equation for any of the clean DDS frequencies, provided that the DDS input clock is accurate (e.g., perfectly accurate or otherwise within an acceptable tolerance range). The DDS clean frequency effect works because, in the defined procedure, DDS operation is restricted to a set of frequencies that possess phase accumulator error characteristics that are synchronous, periodic multiples of the DDS output waveform. In one or more embodiments, DDS operation at any other normally selectable DDS output frequency is not prohibited. Thus, the DDS can operate on clean frequencies and achieve improved SFDR performance, for example, when coupled with an output filter network, or it can operate on any other frequency achieving traditional SFDR performance while maintaining very fine frequency step resolution. As will be appreciated in light of this disclosure, and in accordance with an embodiment, a given clean DDS FCW may be utilized to provide a given clean DDS output frequency.

Optionally, the method may continue, as in block 505, with applying an output filter network to provide additional frequency rejection to achieve the desired enhanced SFDR performance. In accordance with an embodiment of the present invention, the smallest clean frequency step multiple will set the output filter network rejection requirements. Per DDS simulations, −90 dBc or greater narrowband spurious performance at frequency offsets <±0.5 GHz from the DDS frequency carrier may be obtained, in some example cases. Also, per simulations, the wideband DDS spurs at frequency offsets ≥±0.5 GHz from the carrier may be about −35 dBc, in some example cases. To achieve a −70 dBc or greater wideband SFDR, it may be desirable to set the filter network rejection specification at −45 dBc for frequency offsets ≥0.5 GHz, in some example cases.

Numerous variations on this methodology will be apparent in light of this disclosure. As will be appreciated, and in accordance with an embodiment, one or more of the functional boxes (e.g., 501, 502, 503, 504, and/or 505) shown in FIG. 5 can be implemented as a module or sub-module that, when executed by one or more processors or otherwise operated, causes the associated functionality as described herein to be carried out. The modules/sub-modules may be implemented, for instance, in software (e.g., executable instructions stored on one or more computer readable media), firmware (e.g., embedded routines of a microcontroller), and/or hardware (e.g., gate level logic, a field programmable gate array, or purpose-built silicon).

FIGS. 6A-6C illustrate an example set of calculations performed in determining how to set the DDS clock input frequency to ensure that all the DDS clean frequency criteria are satisfied, in accordance with an embodiment of the present invention. FIG. 6A corresponds with, for example, the criterion where each of the required DDS output frequencies will be evenly divisible by the minimum DDS clean frequency step multiple. FIG. 6B corresponds with, for example, the criterion where the DDS Nyquist frequency divided by the minimum DDS clean frequency step multiple will be an exact power of 2 (e.g., $2^1$, $2^2$, . . . , $2^n$). FIG. 6C corresponds with, for example, the criterion where the DDS clock frequency will be greater than 2.3 times the maximum DDS output frequency.

Figure 7B:
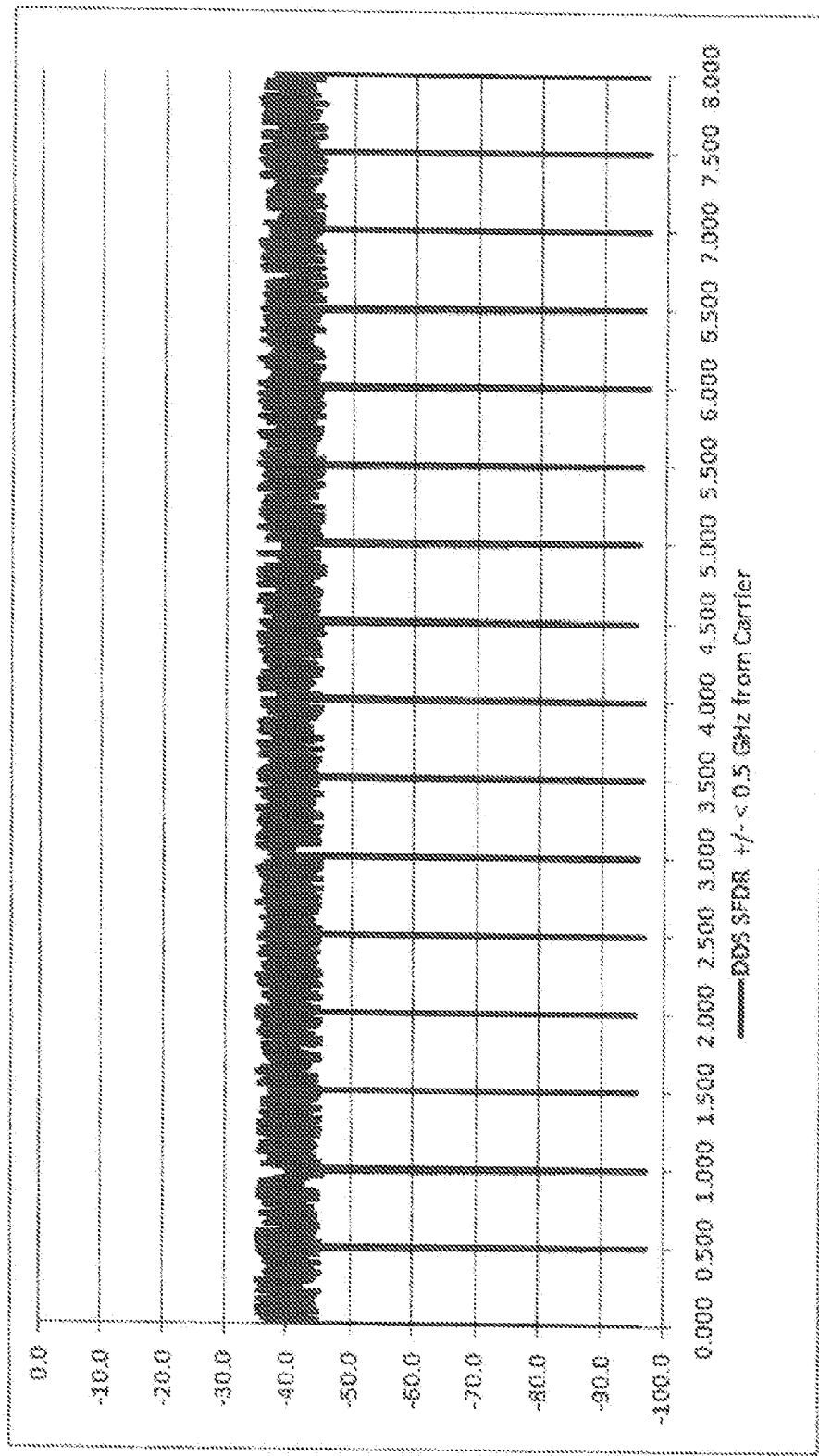
FIG. 7B is a plot of narrowband SFDR as a function of DDS selected frequency, showing the unfiltered DDS SFDR at clean frequencies for the DDS frequency plan of FIG. 7A, in accordance with an embodiment of the present invention.

FIG. 7A is a table of clean frequency parameters for a DDS frequency plan having a clean frequency step size of 0.5 GHz, in accordance with an embodiment of the present invention. As can be seen from this example, the input frequency is 16.0 GHz, the desired output frequencies range from 1.0 to 6.5 GHz, and the clean frequency step size is 0.5 GHz. FIG. 7B is a plot of narrowband SFDR as a function of DDS selected frequency, showing the unfiltered DDS SFDR at clean frequencies for the DDS frequency plan of FIG. 7A, in accordance with an embodiment of the present invention. As can be seen from this example, the system is designed to operate only on the few discrete clean DDS frequencies and filter spurs outside the ±<0.5 GHz clean frequency region.

Figure 8B:
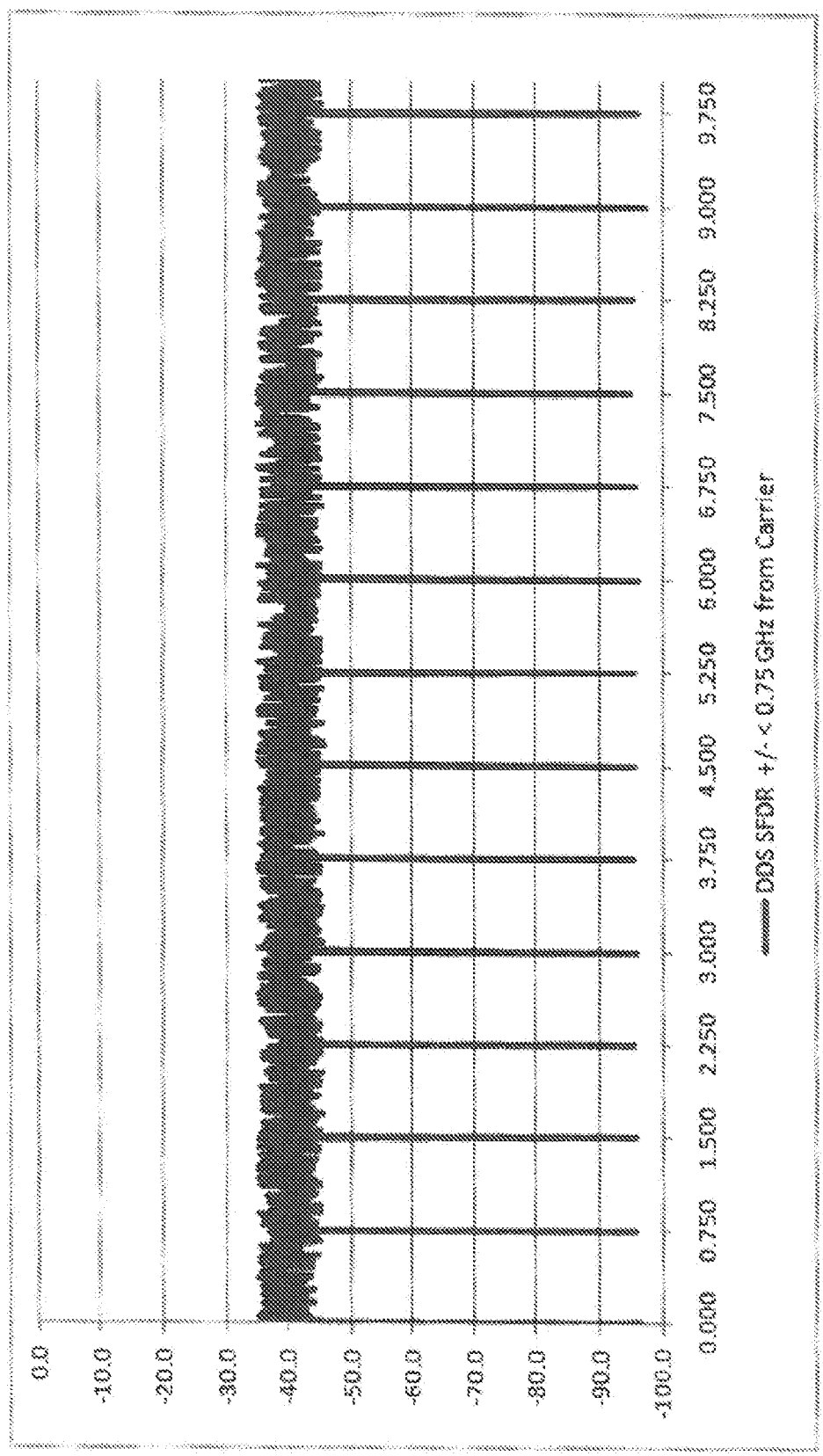
FIG. 8B is a plot of narrowband SFDR as a function of DDS selected frequency, showing the unfiltered DDS SFDR at clean frequencies for the DDS frequency plan of FIG. 8A, in accordance with an embodiment of the present invention.
Figure 9A:
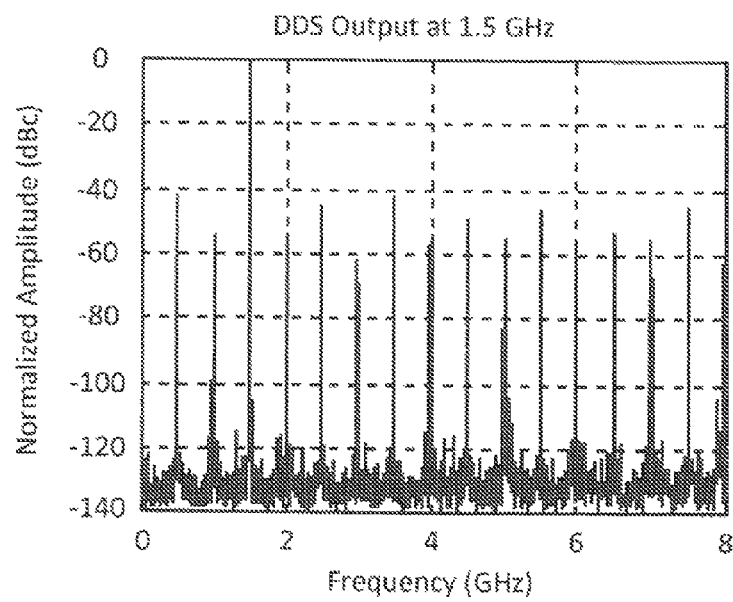
FIGS. 9A-9F are a series of illustrations of DDS output spectra at 0.5 GHz clean frequency steps from 1.5 GHz to 6.5 GHz, in accordance with an embodiment of the present invention.
Figure 9B:
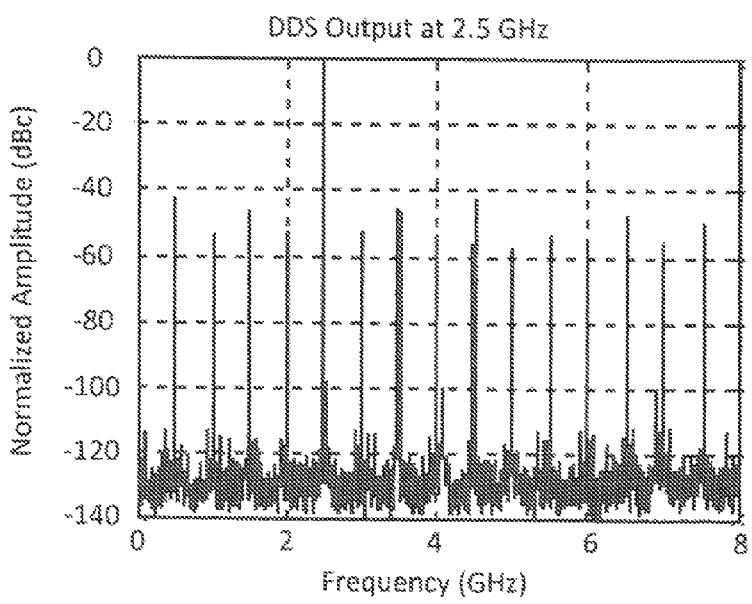
Figure 9C:
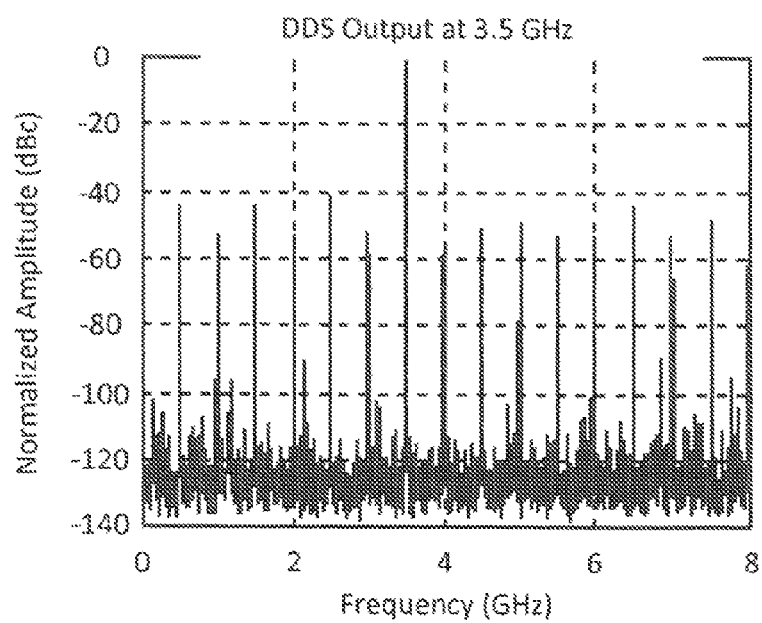
Figure 9D:
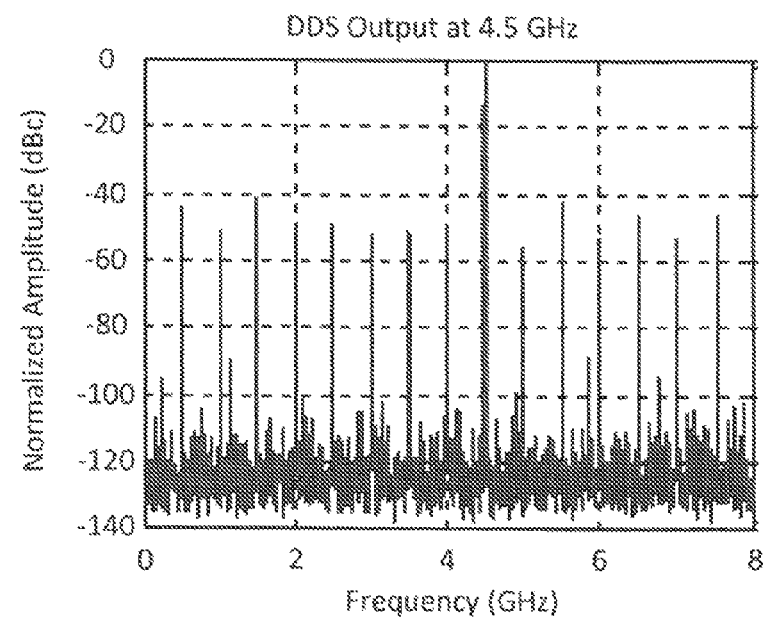
Figure 9E:
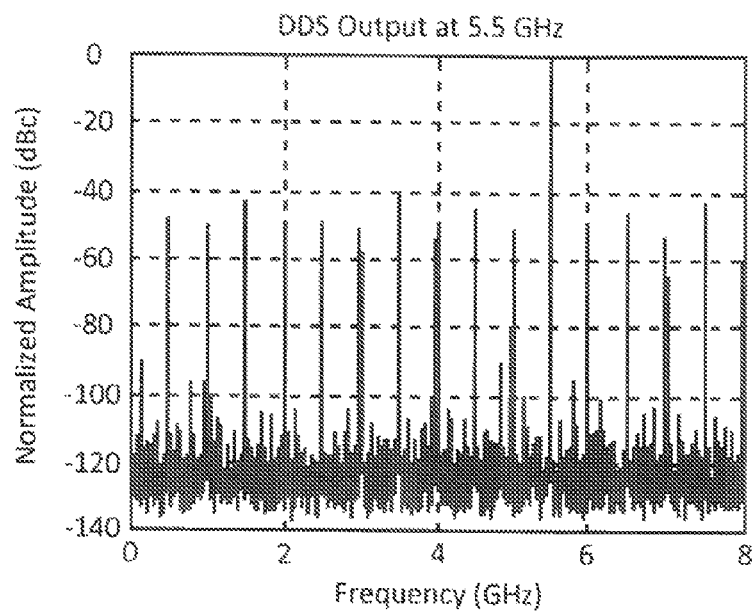
Figure 9F:
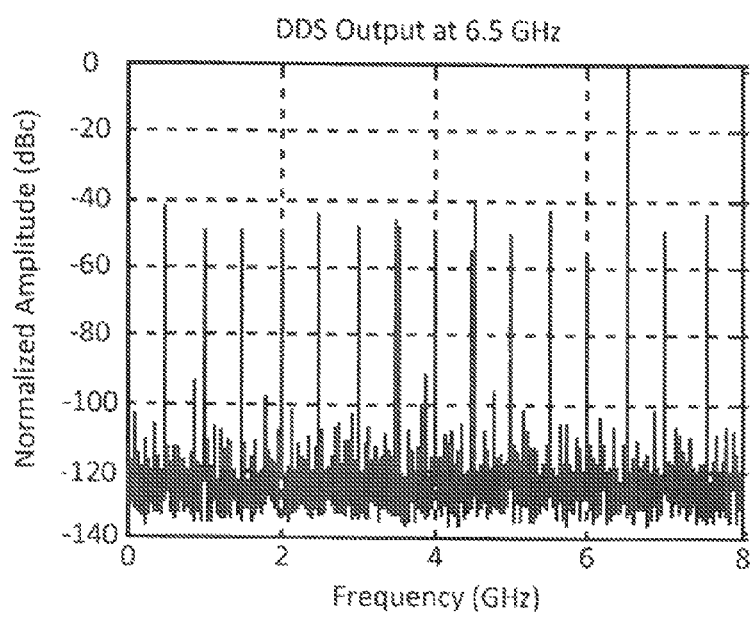

FIG. 8A is a table of clean frequency parameters for a DDS frequency plan having a clean frequency step size of 0.75 GHz, in accordance with an embodiment of the present invention. As can be seen from this example, the input frequency is 24.0 GHz, the desired output frequencies range from 0.75 to 11.25 GHz, and the clean frequency step size is 0.75 GHz. FIG. 8B is a plot of narrowband SFDR as a function of DDS selected frequency, showing the unfiltered DDS SFDR at clean frequencies for the DDS frequency plan of FIG. 8A, in accordance with an embodiment of the present invention. As can be seen from this example, the system is designed to operate only on the few discrete clean DDS frequencies and filter spurs outside the ±<0.75 GHz clean frequency region.

Example Implementation Data

FIGS. 9A-9F are a series of illustrations of DDS output spectra at 0.5 GHz clean frequency steps from 1.5 GHz to 6.5 GHz, in accordance with an embodiment of the present invention. As can be seen, there are no spurs <±0.5 GHz from the carrier.

Figure 10A:
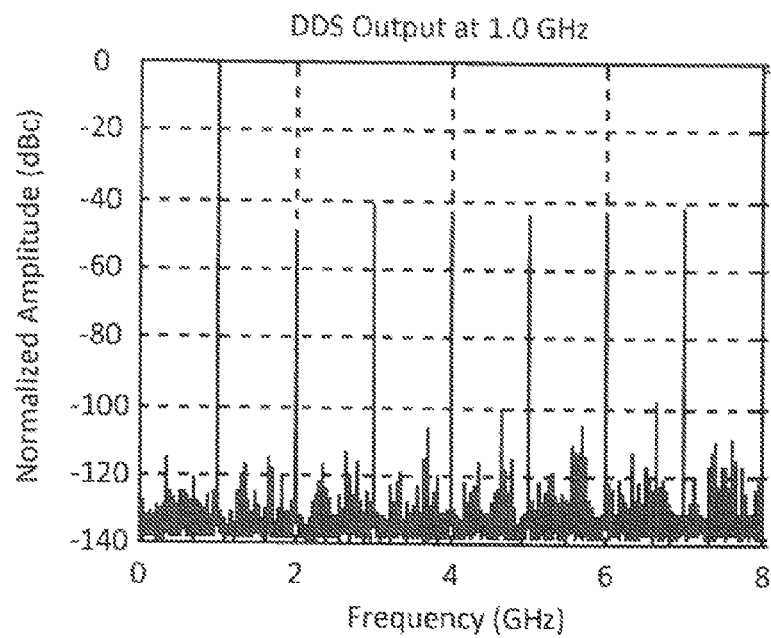
FIGS. 10A-10C are a series of illustrations of DDS output spectra at 1.0 GHz clean frequency steps from 1.0 GHz to 5.0 GHz, in accordance with an embodiment of the present invention.
Figure 10B:
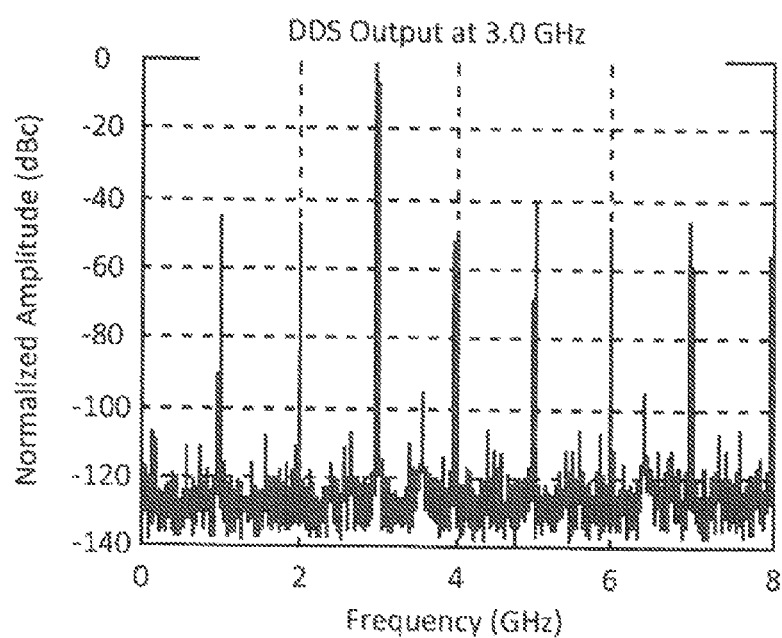
Figure 10C:
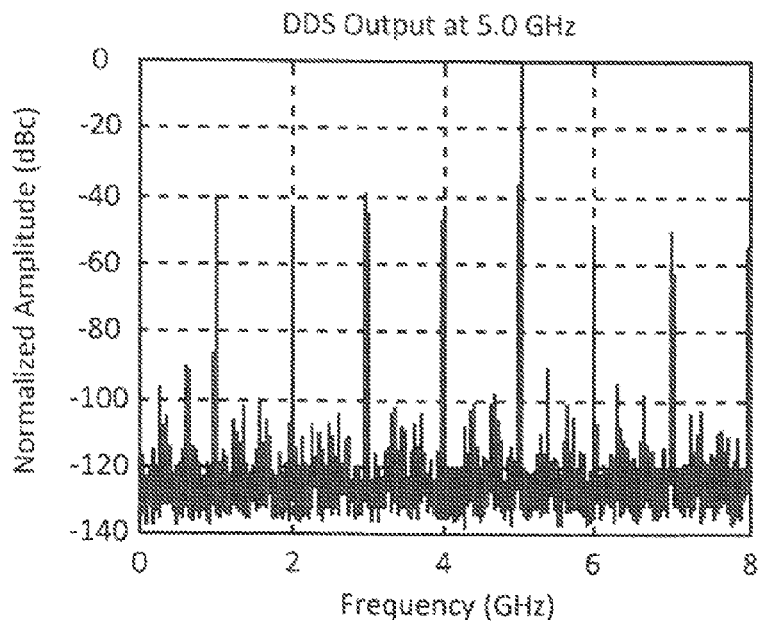

FIGS. 10A-10C are a series of illustrations of DDS output spectra at 1.0 GHz clean frequency steps from 1.0 GHz to 5.0 GHz, in accordance with an embodiment of the present invention. As can be seen, there are no spurs <±1.0 GHz from the carrier.

Figure 11A:
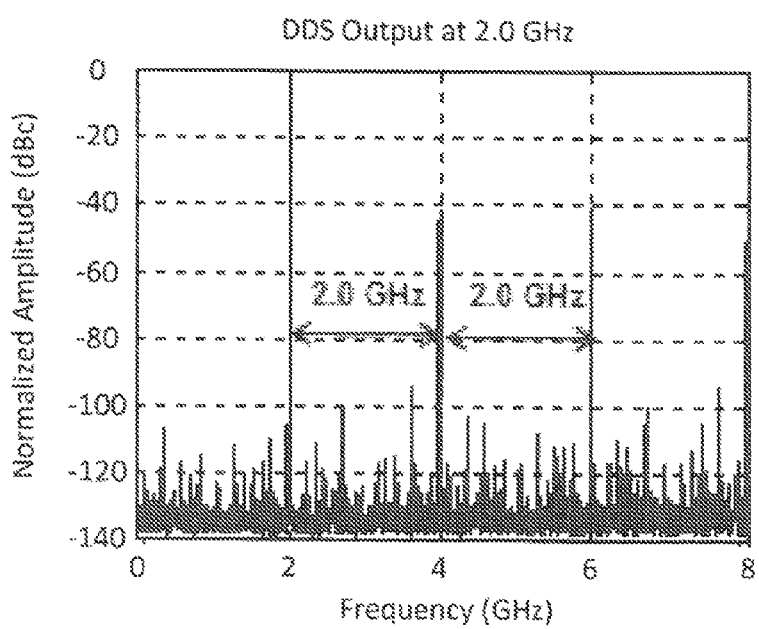
FIGS. 11A-11B are a series of illustrations of DDS output spectra at 2.0 GHz clean frequency steps from 2.0 GHz to 6.0 GHz, in accordance with an embodiment of the present invention.
Figure 11B:
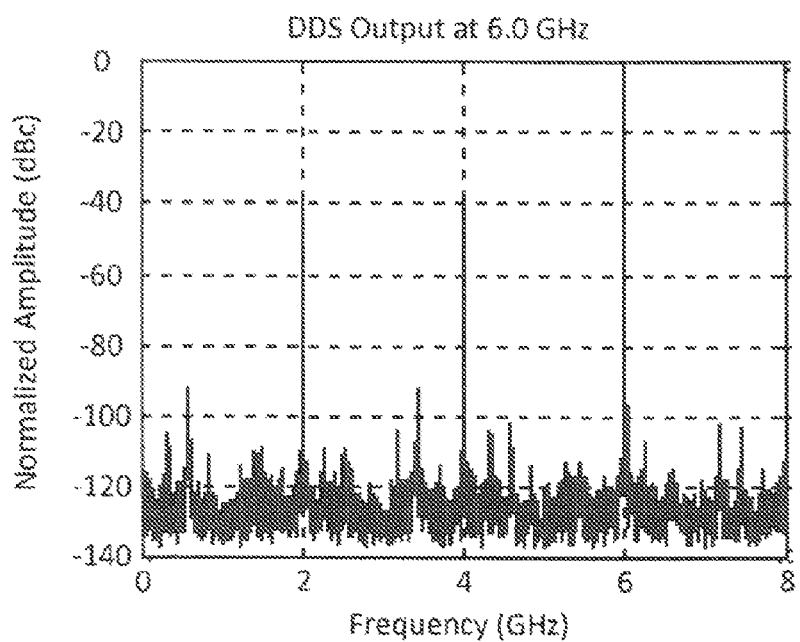

FIGS. 11A-11B are a series of illustrations of DDS output spectra at 2.0 GHz clean frequency steps from 2.0 GHz to 6.0 GHz, in accordance with an embodiment of the present invention. As can be seen, there are no spurs <±2.0 GHz from the carrier.

Figure 12:
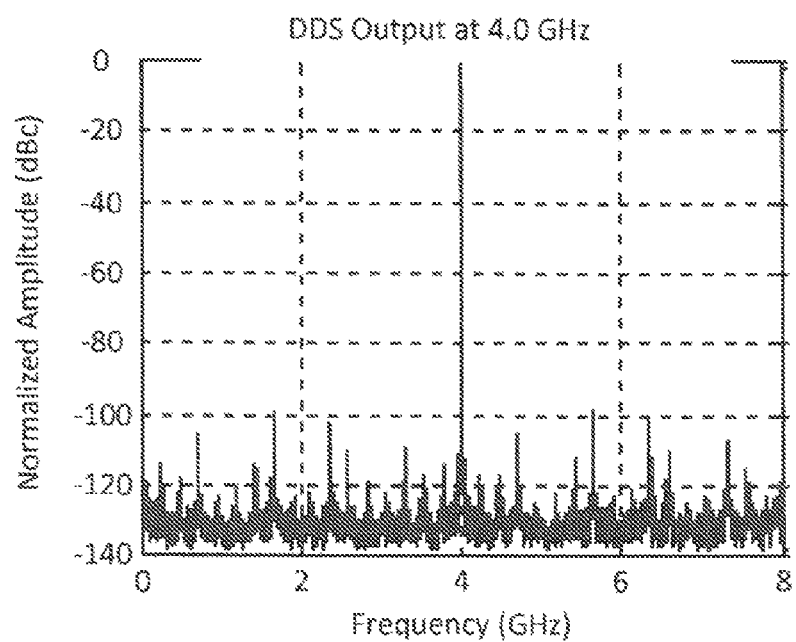
FIG. 12 is an illustration of a DDS output spectrum at a 4.0 GHz clean frequency step, in accordance with an embodiment of the present invention.

FIG. 12 is an illustration of a DDS output spectrum at a 4.0 GHz clean frequency step, in accordance with an embodiment of the present invention. As can be seen, there are no spurs <±4.0 GHz from the carrier.

Figure 13A:
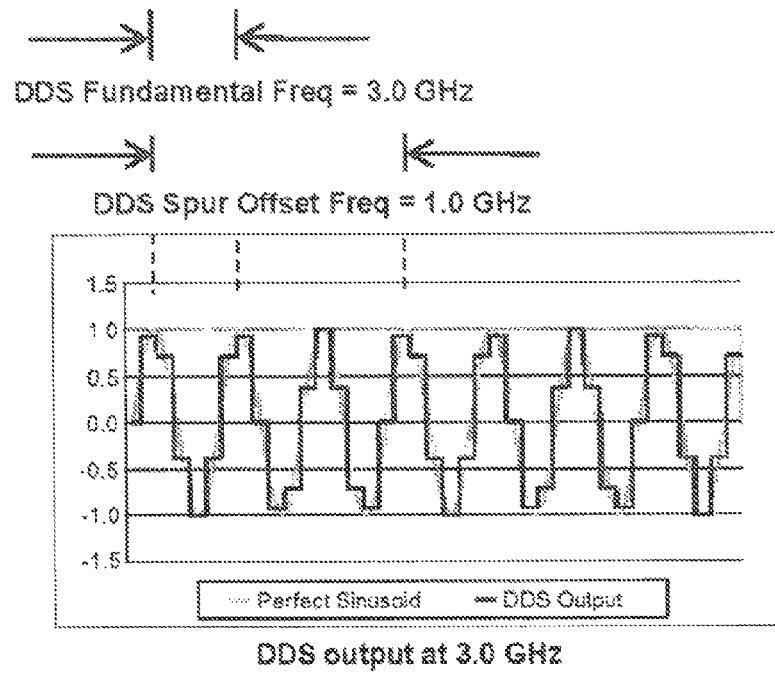
FIGS. 13A and 13B are a time domain (oscilloscope) illustration and a frequency domain (spectrum analyzer) illustration, respectively, of a DDS output signal at 3.0 GHz, in accordance with an embodiment of the present invention.
Figure 13B:
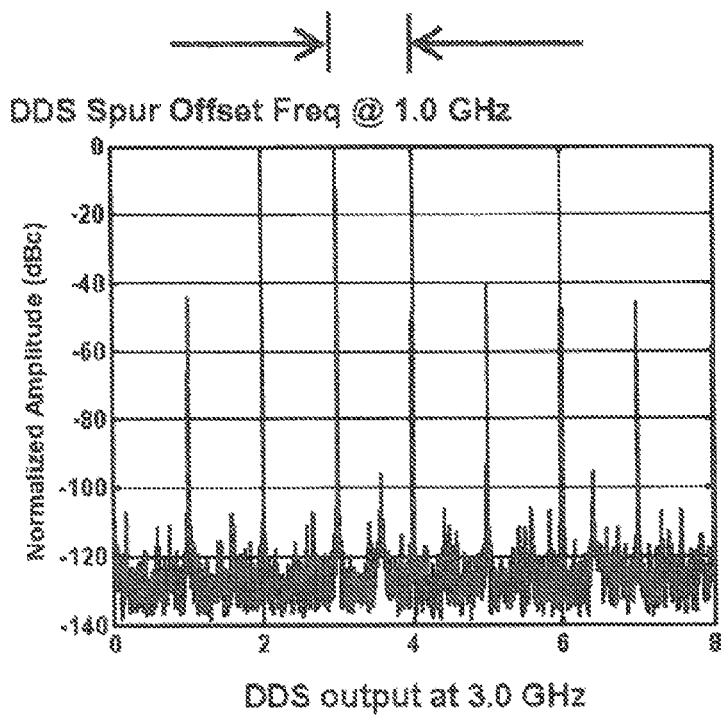

FIGS. 13A and 13B are a time domain (oscilloscope) illustration and a frequency domain (spectrum analyzer) illustration, respectively, of a DDS output signal at 3.0 GHz, in accordance with an embodiment of the present invention. Here, the 3.0 GHz DDS output signal has a clock rate of 16.0 GHz, a Nyquist frequency of 8.0 GHz, and a Nyquist sub-multiple step of 1.0 GHz. By virtue of the constrained relationship between the DDS output frequency and the DDS clock sampling frequency, the time domain waveform contains periodic errors that repeat at a rate equal to the Nyquist sub-multiple step size (e.g., 1.0 GHz, or every third cycle). This error appears in the frequency spectrum as spurs offset from the DDS fundamental by the Nyquist sub-multiple step size (1.0 GHz). If the clean frequency step size is kept sufficiently large using the disclosed techniques, then the offset spurs, in accordance with an embodiment, can be suppressed with filtering, providing for improved/enhanced SFDR performance.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method of enhancing spurious free dynamic range (SFDR) performance in a direct digital synthesizer (DDS)-based system, the method comprising:
providing a plurality of DDS output frequencies such that each is evenly divisible by a common frequency step multiple;
providing a DDS input clock frequency greater than or equal to two times a maximum DDS output frequency such that a Nyquist criterion is met for the plurality of DDS output frequencies, where the Nyquist criterion is when a DDS Nyquist frequency results in an exact power of 2 when divided by a minimum clean frequency step multiple;
adjusting the DDS input clock frequency such that the resulting common frequency step multiple is a clean frequency step multiple, where the clean frequency step multiple=

$$\frac{DDS\ \text{Nyquist Frequency}}{2^n},$$

where n is 1, 2, 3, ..., and thus is evenly divisible into each of the plurality if DDS output frequencies and a resulting DDS Nyquist frequency, wherein the $$DDS\ \text{Nyquist Frequency} == \frac{DDS\ \text{Clock Frequency}}{2};$$

applying a clean DDS frequency control word (FCW) to each DDS output frequency using the DDS input clock frequency;
selecting a plurality of desired DDS output frequencies; and
filtering spurs outside a clean frequency region to enhance spurious free dynamic range (SFDR) performance, wherein the clean frequency region is equal to ± the clean frequency step size.

2. The method of claim 1, further comprising applying an output filter network to provide additional frequency rejection.

3. The method of claim 1, wherein the clean DDS FCW is calculated via the following equation:

$$DDS\ FCW = \frac{DDS\ \text{Output Frequency}}{DDS\ \text{Clock Frequency}} \times 2^{Number\ of\ FCW\ Bits}.$$

4. The method of claim 1, wherein wideband SFDR performance is about −40 dBc or better and/or narrowband SFDR performance is about −70 dBc or better.

5. The method of claim 1, wherein wideband and narrowband SFDR performance are about −70 dBc or better.

6. The method of claim 1, wherein at least a portion of the method is performed in a system on chip (SOC), in a circuit on a printed circuit board (PCB), and/or in an integrated circuit (IC).

7. The method of claim 1, wherein at least a portion of the method is performed in at least one of a transmitter, a receiver, an up-converter, a down-converter, a power amplifier, and/or an oscillator.

8. The method of claim 1, further comprising adjusting the DDS output frequency such that the resulting common frequency step multiple is a clean frequency step multiple, and thus evenly divisible into each of the plurality of DDS output frequencies and a resulting DDS Nyquist frequency.

* * * * *